(12) United States Patent
Choi et al.

(10) Patent No.: US 12,119,306 B2
(45) Date of Patent: Oct. 15, 2024

(54) SEMICONDUCTOR PACKAGE

(71) Applicant: Samsung Electronics Co., Ltd., Suwon-si (KR)

(72) Inventors: Ju-Il Choi, Seongnam-si (KR); Gyuho Kang, Cheonan-si (KR); Un-Byoung Kang, Hwaseong-si (KR); Byeongchan Kim, Asan-si (KR); Junyoung Park, Asan-si (KR); Jongho Lee, Hwaseong-si (KR); Hyunsu Hwang, Siheung-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/307,277

(22) Filed: Apr. 26, 2023

(65) Prior Publication Data

US 2023/0260923 A1 Aug. 17, 2023

Related U.S. Application Data

(63) Continuation of application No. 17/349,174, filed on Jun. 16, 2021, now Pat. No. 11,682,630.

(30) Foreign Application Priority Data

Jul. 31, 2020 (KR) .................. 10-2020-0096176
Jan. 15, 2021 (KR) .................. 10-2021-0006217

(51) Int. Cl.
| | | |
|---|---|---|
| *H01L 23/538* | (2006.01) | |
| *H01L 23/00* | (2006.01) | |
| *H01L 23/31* | (2006.01) | |
| *H01L 23/498* | (2006.01) | |
| *H01L 25/10* | (2006.01) | |

(52) U.S. Cl.
CPC ...... *H01L 23/5389* (2013.01); *H01L 23/3128* (2013.01); *H01L 23/49811* (2013.01);
(Continued)

(58) Field of Classification Search
CPC .......... H01L 23/49822; H01L 23/5383; H01L 24/20; H01L 21/4857;
(Continued)

(56) References Cited

U.S. PATENT DOCUMENTS

| | | |
|---|---|---|
| 9,165,850 B2 | 10/2015 | Daubenspeck et al. |
| 9,653,406 B2 | 5/2017 | Shih et al. |

(Continued)

FOREIGN PATENT DOCUMENTS

| | | |
|---|---|---|
| CN | 103369873 A | 10/2013 |
| KR | 2001-0058209 A | 7/2001 |
| KR | 2021-0133524 A | 11/2021 |

*Primary Examiner* — Evan G Clinton
(74) *Attorney, Agent, or Firm* — Harness, Dickey & Pierce, P.L.C.

(57) ABSTRACT

A semiconductor package including a redistribution substrate including an insulating layer and redistribution patterns in the insulating layer may be provided. Each of the redistribution patterns may include a via portion, a pad portion vertically overlapping the via portion, and a line portion extending from the pad portion. The via portion, the pad portion, and the line portion may be connected to each other to form a single object. A level of a bottom surface of the pad portion may be lower than a level of a bottom surface of the line portion. A width of the line portion may have a largest value at a level between a top surface of the line portion and the bottom surface of the line portion.

20 Claims, 21 Drawing Sheets

(52) U.S. Cl.
CPC .. *H01L 23/49822* (2013.01); *H01L 23/49838* (2013.01); *H01L 23/5383* (2013.01); *H01L 24/16* (2013.01); *H01L 25/105* (2013.01); *H01L 2224/16225* (2013.01)

(58) Field of Classification Search
CPC ....... H01L 21/76801–76804; H01L 21/76816; H01L 21/76811; H01L 21/76802–76813
See application file for complete search history.

(56) References Cited

U.S. PATENT DOCUMENTS

| | | |
|---|---|---|
| 10,115,668 B2 | 10/2018 | Reingruber et al. |
| 2008/0171434 A1* | 7/2008 | Chang ............... H01L 21/76808 |
| | | 438/666 |
| 2015/0104947 A1* | 4/2015 | Kim ................. H01L 29/66795 |
| | | 438/703 |
| 2016/0379946 A1 | 12/2016 | Maekawa et al. |
| 2017/0154859 A1* | 6/2017 | Yap ........................ H01L 23/66 |
| 2017/0236751 A1* | 8/2017 | Park ................. H01L 21/76834 |
| | | 438/667 |
| 2019/0206783 A1 | 7/2019 | Kim |
| 2019/0341360 A1 | 11/2019 | Yu et al. |
| 2019/0393150 A1* | 12/2019 | Liu ........................ H01L 21/56 |
| 2020/0051949 A1 | 2/2020 | Tsai et al. |
| 2020/0091066 A1 | 3/2020 | Kim et al. |
| 2020/0126923 A1* | 4/2020 | Hu ...................... H01L 21/0274 |
| 2021/0134717 A1 | 5/2021 | Aritsuka et al. |
| 2021/0343634 A1 | 11/2021 | Choi et al. |

\* cited by examiner

FIG. 11
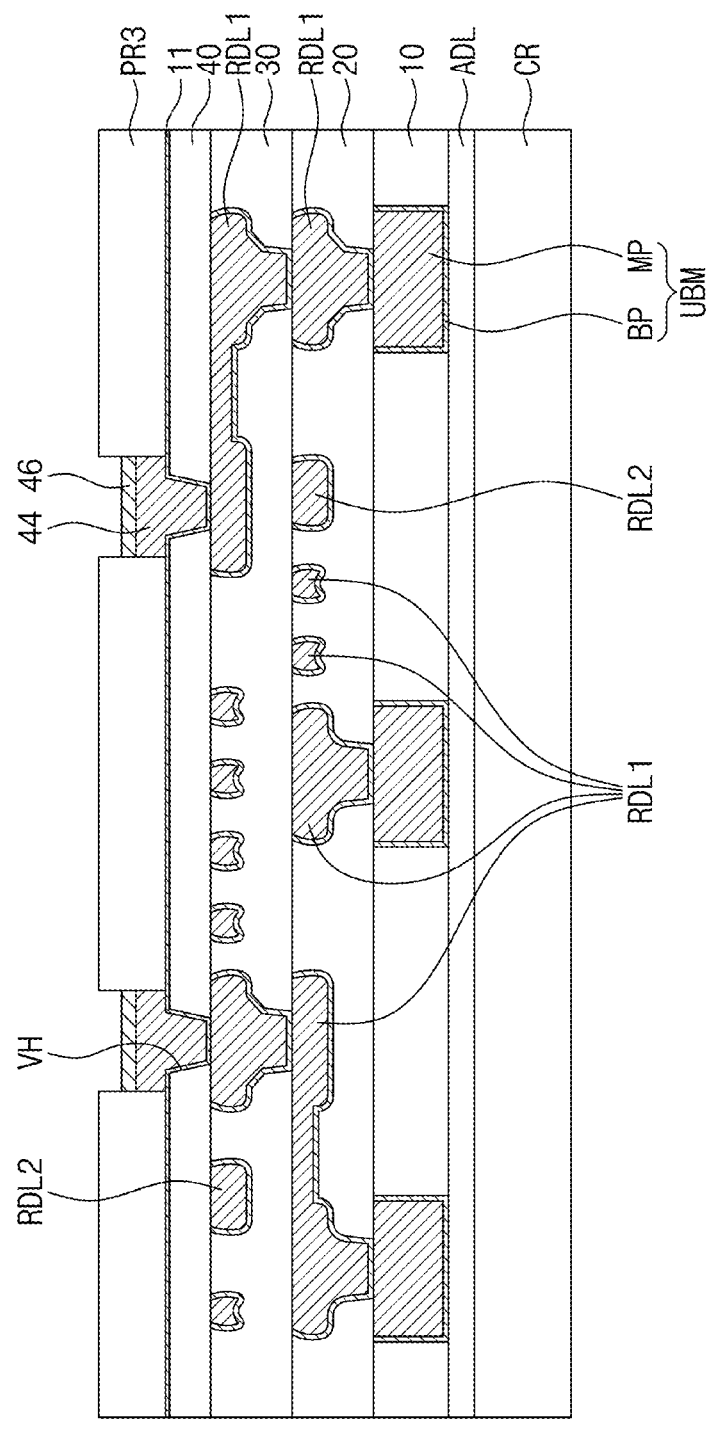
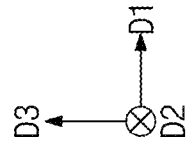

SEMICONDUCTOR PACKAGE

CROSS-REFERENCE TO RELATED APPLICATIONS

This U.S. non-provisional patent application is a continuation of U.S. application Ser. No. 17/349,174, filed on Jun. 16, 2021, which claims priority under 35 U.S.C. § 119 to Korean Patent Application Nos. 10-2020-0096176 and 10-2021-0006217, filed on Jul. 31, 2020 and Jan. 15, 2021, respectively, in the Korean Intellectual Property Office, the entire contents of each of which are hereby incorporated by reference.

BACKGROUND

The present disclosure relates to semiconductor packages, and in particular, to semiconductor packages including a redistribution substrate and having an increased integration density and improved reliability.

A semiconductor package is configured to easily use a semiconductor chip as a part of an electronic product. In general, the semiconductor package includes a printed circuit board (PCB) and a semiconductor chip, which is mounted on the PCB and is electrically connected to the PCB by bonding wires or bumps. With development of the electronic industry, many studies are being conducted to improve reliability of the semiconductor package and to reduce a size of the semiconductor package.

SUMMARY

Some example embodiments of the inventive concepts provide semiconductor packages having an increased integration density and improved reliability.

According to an example embodiment of the inventive concepts, a semiconductor package may include a redistribution substrate including an insulating layer and redistribution patterns in the insulating layer. Each of the redistribution patterns may include a via portion, a pad portion vertically overlapping the via portion, and a line portion extending from the pad portion. The via portion, the pad portion, and the line portion may be connected to each other to form a single object. A level of a bottom surface of the pad portion may be lower than a level of a bottom surface of the line portion, and a width of the line portion may have a largest value at a level between a top surface of the line portion and the bottom surface of the line portion.

According to an example embodiment of the inventive concepts, a semiconductor package may include a redistribution substrate including an insulating layer and redistribution patterns in the insulating layer. Each of the redistribution patterns may include a via portion, a pad portion, and a line portion that are connected to each other to form a single object. The pad portion may vertically overlap the via portion and the line portion may extend from the pad portion. A level of a bottom surface of the pad portion may be lower than a level of a bottom surface of the line portion. A side surface of the via portion may have a linear shape, and a side surface of the pad portion may have a rounded shape.

According to an example embodiment of the inventive concepts, a semiconductor package may include a lower redistribution substrate including an insulating layer and first redistribution patterns in the insulating layer, a first semiconductor chip on the lower redistribution substrate, the first semiconductor chip including chip pads, first connection terminals being between and connecting the lower redistribution substrate and the chip pads of the first semiconductor chip, a mold layer on the lower redistribution substrate to cover the first semiconductor chip, metal pillars around the first semiconductor chip to penetrate the mold layer and connected to the lower redistribution substrate, and an upper redistribution substrate on the mold layer may be provided. The upper redistribution substrate may include an upper insulating layer and an upper redistribution pattern on the upper insulating layer. Each of the first redistribution patterns may include a first via portion, a first pad portion, and a first line portion that are connected to each other to form a single object. The first pad portion may vertically overlap the first via portion, and the first line portion may extend from the first pad portion. A level of a bottom surface of the first line portion may be lowered with increasing distance from a center portion of the first line portion in an outward direction.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1, 2, 3, 4, 5, 6, 7, 10, 11, 12, and 13 are sectional views illustrating a method of fabricating a semiconductor package according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or

DETAILED DESCRIPTION

Example embodiments of the inventive concepts will now be described more fully with reference to the accompanying drawings, in which some example embodiments are shown.

While the term "same," "equal," or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%). Similarly, when the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIGS. 1, 2, 3, 4, 5, 6, 7, 10, 11, 12, and 13 are sectional views illustrating a method of fabricating a semiconductor package according to an example embodiment of the inventive concepts.

Figure 1:
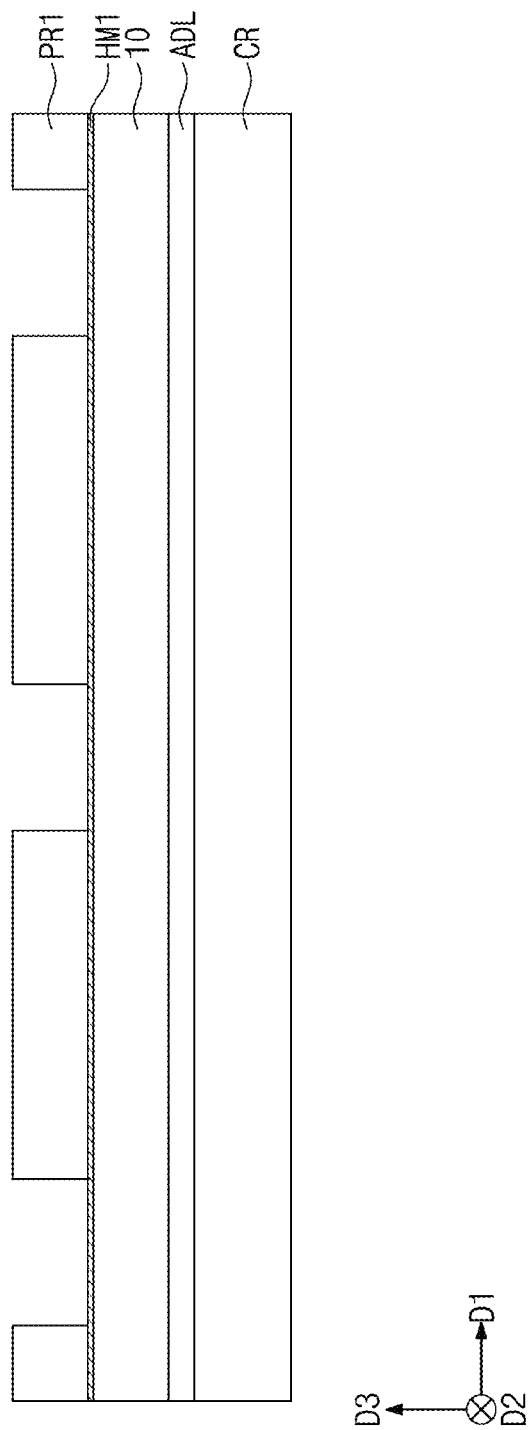

Referring to FIG. 1, an adhesive layer ADL may be formed on a carrier substrate CR. The carrier substrate CR may be a glass substrate. The adhesive layer ADL may be a polymer tape, which is formed of or includes, for example, an insulating material. In an example embodiment, a metal layer may be formed to protect the carrier substrate CR before the formation of the adhesive layer ADL.

A first insulating layer 10 may be formed on the adhesive layer ADL. The formation of the first insulating layer 10 may include performing a coating process (e.g., a spin coating process or a slit coating process) and performing a curing process. The first insulating layer 10 may be formed of or include at least one of photo-imageable dielectric materials. The first insulating layer 10 may include, for example, a photo-imageable polymer. The photo-imageable polymer may include at least one of, for example, photo-imageable polyimide, polybenzoxazole, phenol-based polymers, or benzocyclobutene-based polymers.

A first hard mask layer HM1 may be formed on the first insulating layer 10. The first hard mask layer HM1 may be formed of or include a material that is chosen to have an etch selectivity with respect to the first insulating layer 10. The first hard mask layer HM1 may be formed of or include at least one of metallic materials (e.g., titanium, titanium nitride, tantalum, tantalum nitride, or tungsten). As an example, the first hard mask layer HM1 may be formed of or include titanium.

A first photoresist pattern PR1 may be formed on the first hard mask layer HM1. The formation of the first photoresist patterns PR1 may include forming a photoresist layer on the first hard mask layer HM1 and performing exposing and developing processes on the photoresist layer.

Figure 2:
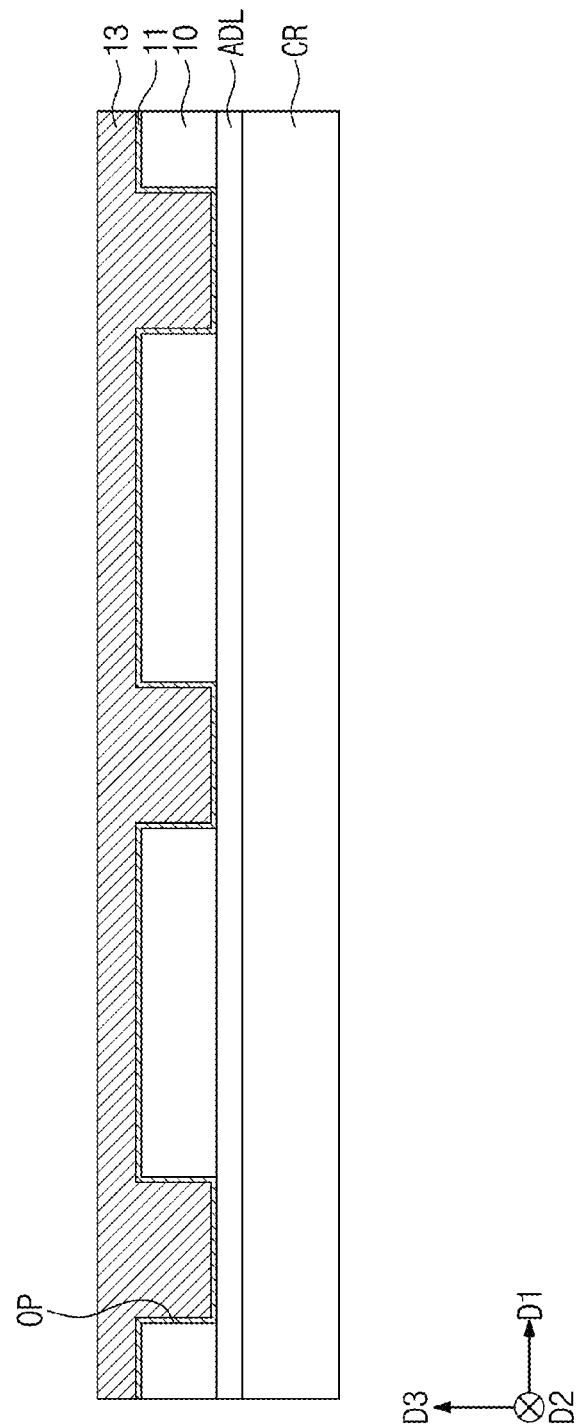

Referring to FIGS. 1 and 2, the first hard mask layer HM1 may be patterned using the first photoresist pattern PR1 as an etch mask. Thereafter, the first insulating layer 10 may be patterned using the patterned first hard mask layer HM1 as an etch mask. The patterning processes may include, for example, a dry etching process. As a result of the patterning process, a plurality of openings OP may be formed to penetrate the first insulating layer 10.

After the patterning process of the first insulating layer 10 and the first hard mask layer HM1, the first photoresist pattern PR1 and the remaining portion of the first hard mask layer HM1 may be removed. In an example embodiment, the remaining portion of the first hard mask layer HM1 may be removed by a wet etching process.

Next, a seed/barrier layer 11 may be formed on the first insulating layer 10 and the adhesive layer ADL. The seed/barrier layer 11 may be formed of or include at least one of conductive materials (e.g., copper/titanium (Cu/Ti)). A metal layer 13 may be formed on the seed/barrier layer 11 to fill the openings OP in the first insulating layer 10. The metal layer 13 may be formed of or include at least one of metallic materials (e.g., copper) and may be extended to a region on a top surface of the first insulating layer 10. The metal layer 13 may be formed by an electroplating process using the seed/barrier layer 11 as an electrode.

Figure 3:
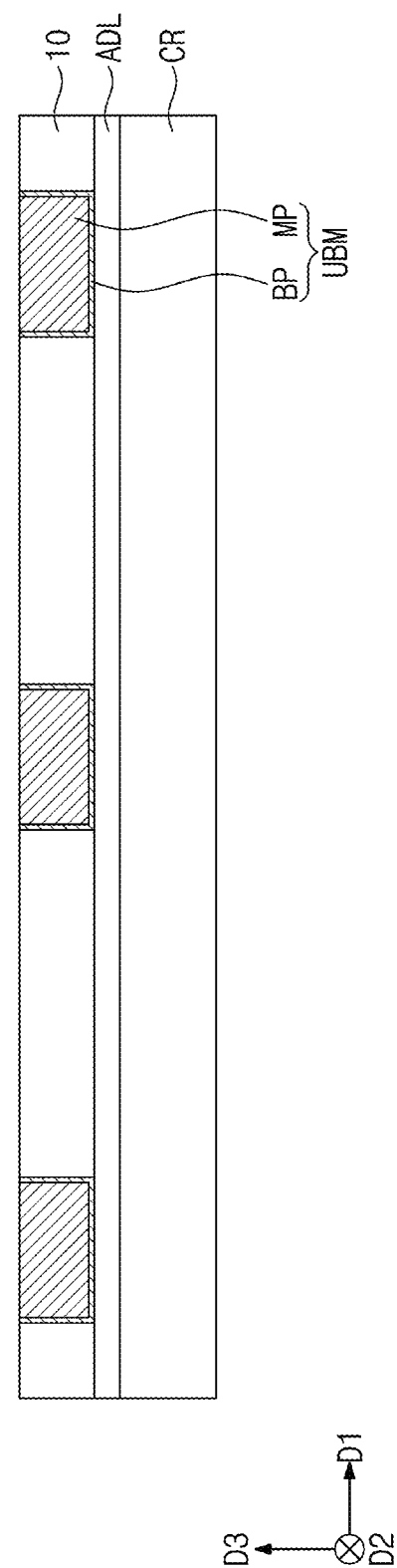

Referring to FIG. 3, a planarization process may be performed on the seed/barrier layer 11 and the metal layer 13 to form an under-bump pattern UBM. The under-bump pattern UBM may include a seed/barrier pattern BP and a metal pattern MP. As a result of the planarization process, the seed/barrier layer 11 and the metal layer 13 may form the seed/barrier pattern BP and the metal pattern MP, respectively. The seed/barrier pattern BP may be disposed in the first insulating layer 10 and may be disposed between a bottom surface of the metal pattern MP and the first insulating layer 10 and between a side surface of the metal pattern MP and the first insulating layer 10.

In an example embodiment, the planarization process may be performed using a chemical mechanical polishing process. The planarization process may be performed until the top surface of the first insulating layer 10 is exposed.

Figure 4:
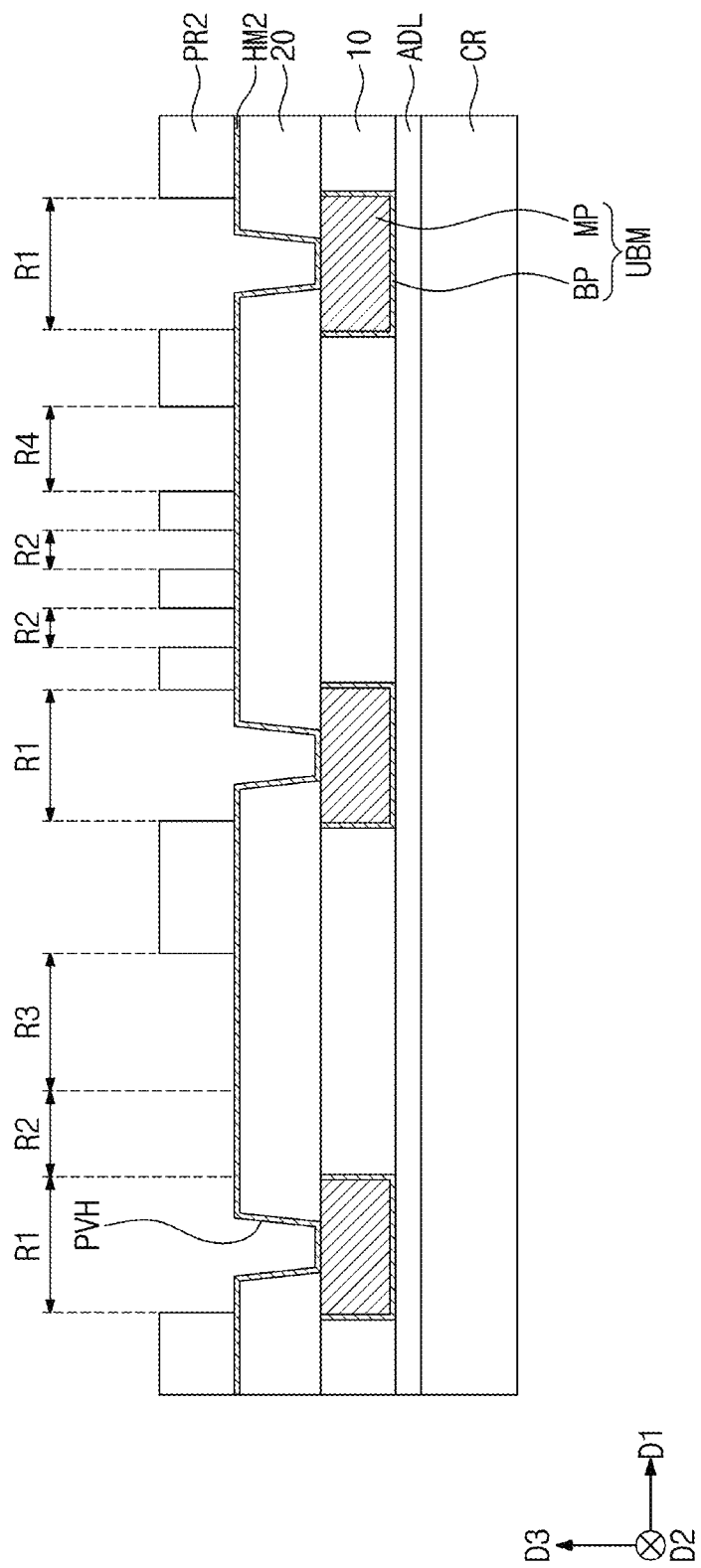

Referring to FIG. 4, a second insulating layer 20 including preliminary via holes PVH may be formed on the first insulating layer 10. The second insulating layer 20 may include the same or similar photo-imageable dielectric material as the first insulating layer 10. The preliminary via holes PVH may be formed to expose portions of the under-bump pattern UBM. The preliminary via holes PVH may be formed by performing exposing and developing processes on the second insulating layer 20. Thereafter, a curing process may be performed on the second insulating layer 20.

A second hard mask layer HM2 may be formed on the second insulating layer 20 provided with the preliminary via holes PVH. The second hard mask layer HM2 may conformally cover inner surfaces of the preliminary via holes PVH and a top surface of the second insulating layer 20. The second hard mask layer HM2 may cover top surfaces of the under-bump patterns UBM exposed through the preliminary via holes PVH.

A second photoresist pattern PR2 may be formed on the second hard mask layer HM2. The second photoresist patterns PR2 may be formed by forming a photoresist layer on the second hard mask layer HM2 and performing exposing and developing processes on the photoresist layer.

The second photoresist pattern PR2 may be formed to have openings exposing portions of the second hard mask layer HM2. The second photoresist pattern PR2 may include a first opening region R1, a second opening region R2, a third opening region R3, and a fourth opening region R4.

The first opening region R1 may define a region, in which a first trench to be described below will be formed. The second opening region R2 may define a region, in which a second trench will be formed. The third opening region R3 may define a region, in which a third trench will be formed. The fourth opening region R4 may define a region, in which a fourth trench will be formed. The first opening region R1 may vertically overlap the preliminary via hole PVH.

Figure 5:
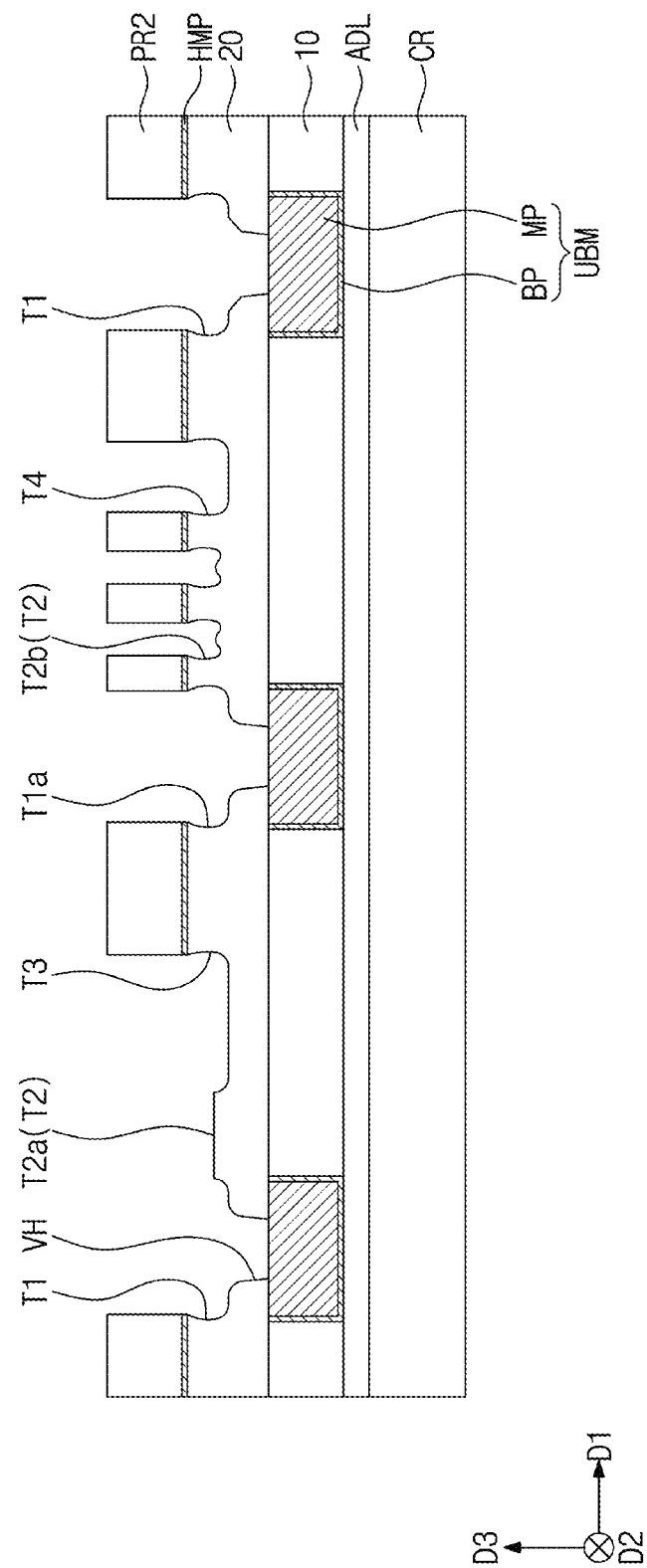

Referring to FIGS. 4 and 5, an anisotropic etching process may be performed on the second hard mask layer HM2, using the second photoresist pattern PR2 as an etch mask. Accordingly, a hard mask pattern HMP may be formed on the second insulating layer 20. The anisotropic etching process on the second hard mask layer HM2 may be performed using at least one of a reactive ion etching (RIE) process, a magnetically-enhanced reactive ion etching (ME-RIE) process, an inductively-coupled plasma (ICP) etching process, a transformer coupled plasma (TCP) etching process, a hollow anode-type plasma etching process, or a helical resonator plasma etching process.

Next, an anisotropic etching process may be performed on the second insulating layer 20, using the hard mask pattern HMP as an etch mask.

Accordingly, first to fourth trenches T1, T2, T3, and T4 may be formed in the second insulating layer 20, and via holes VH may be formed to expose the under-bump pattern UBM. The first trench T1, the second trench T2, the third trench T3, and the via hole VH may be connected to each other. Each of the first and third trenches T1 and T3 may be shaped like a circular hole, when viewed in a plan view. The second trench T2 may be a line-shaped region that extends in a first direction D1 and/or a second direction D2. The fourth trench T4 may be a line-shaped region that extends in the first direction D1 and/or the second direction D2. In FIG. 5, the section of the second trench T2 extending in the first direction D1 is indicated by the reference number T2a, and the section of the second trench T2, which linearly extends in the second direction D2, is indicated by the reference number T2b. The section of the fourth trench T4, which extends in the second direction D2, is illustrated as an example. A width of each of the first, third, fourth trenches T1, T2, and T4 may be larger than a width of the second trench T2.

Due to a loading effect, which may occur in a process of forming the first and second trenches T1 and T2 of different widths, the second trenches T2 may have a depth that is different from a depth of the first trenches T1. In an example embodiment, the depth of the first trenches T1 may be larger than the depth of the second trenches T2. The third trench T3 and the fourth trench T4 may have widths larger than the second trenches T2. The depth of the third trench T3 and the depth of the fourth trench T4 may be larger than the depth of the second trench T2.

Because the first trenches T1 are formed after the formation of the preliminary via holes PVH of FIG. 4, a corner portion, at which the preliminary via hole PVH and the first trench T1 are connected to each other, may have a round surface or an inclined surface, during the anisotropic etching of the second insulating layer 20. The corner portion may have a varying profile which defines a width in the D1 direction to vary along a vertical direction (e.g., along the D3 direction).

Further, lower corners of the second trenches T2 may be rounded and a level of a center portion of a bottom surface of the each of the second trenches T2 may be higher than a level of an edge portion of the bottom surface of a corresponding one of the second trenches T2.

Furthermore, due to a bowing effect, which may occur in the etching process to form the first to fourth trenches T1 to T4, the first to fourth trenches T1 to T4 may have rounded side surfaces. For example, the first to fourth trenches T1 to T4 may have laterally convex side surfaces.

Figure 6:
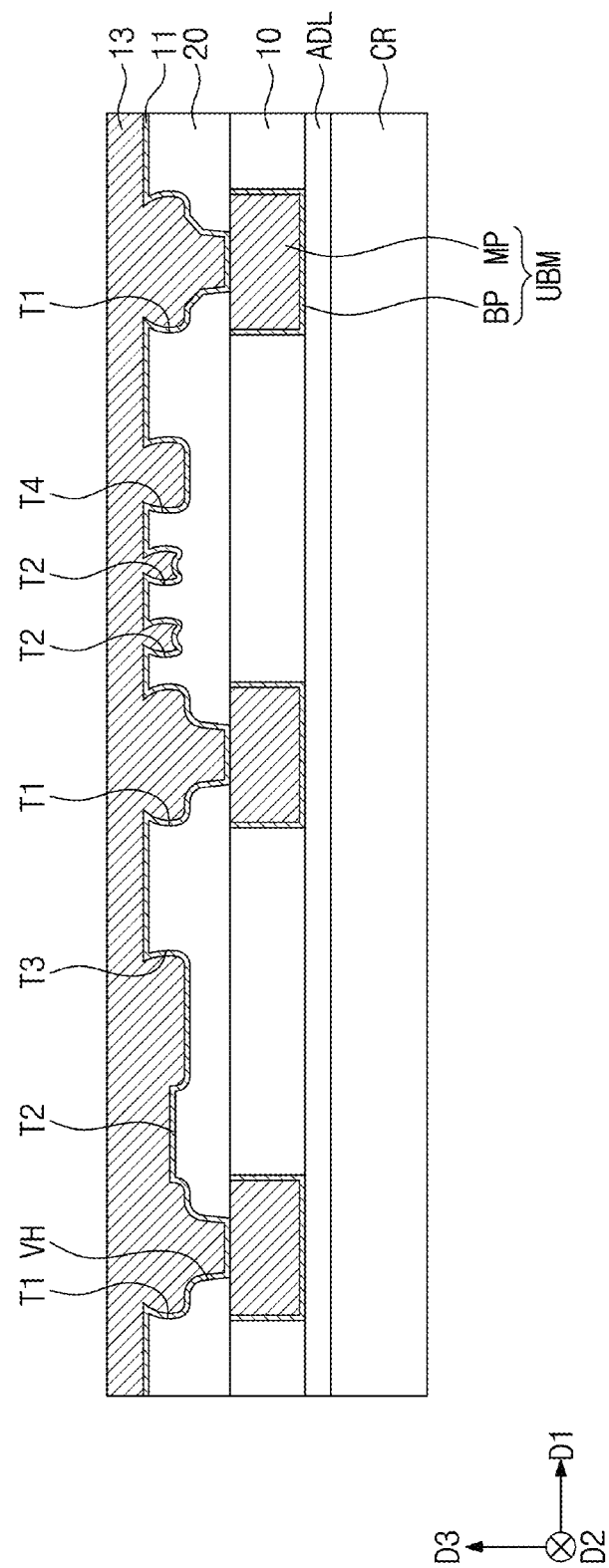

Referring to FIG. 6, the second photoresist pattern PR2 and the hard mask pattern HMP may be removed. The second photoresist pattern PR2 may be removed using a strip process. The hard mask pattern HMP may be removed using a wet etching process.

Thereafter, the seed/barrier layer 11 and the metal layer 13 may be sequentially formed to fill the via holes VH and the first to fourth trenches T1 to T4.

The seed/barrier layer 11 may be deposited on the second insulating layer 20, in which the via holes VH and the first to fourth trenches T1 to T4 are formed, to have a substantially uniform thickness. In other words, the seed/barrier layer 11 may be disposed to conformally cover inner surfaces of the via holes VH, inner surfaces of the first to fourth trenches T1 to T4, and the top surface of the second insulating layer 20. The seed/barrier layer 11 may be formed by a PVD, CVD, or ALD process.

The metal layer 13 may be formed to fully fill the via holes VH and the first to fourth trenches T1 to T4 provided with the seed/barrier layer 11. The metal layer 13 may also be formed on the top surface of the second insulating layer 20. The metal layer 13 may be formed by an electroplating process.

Figure 7:
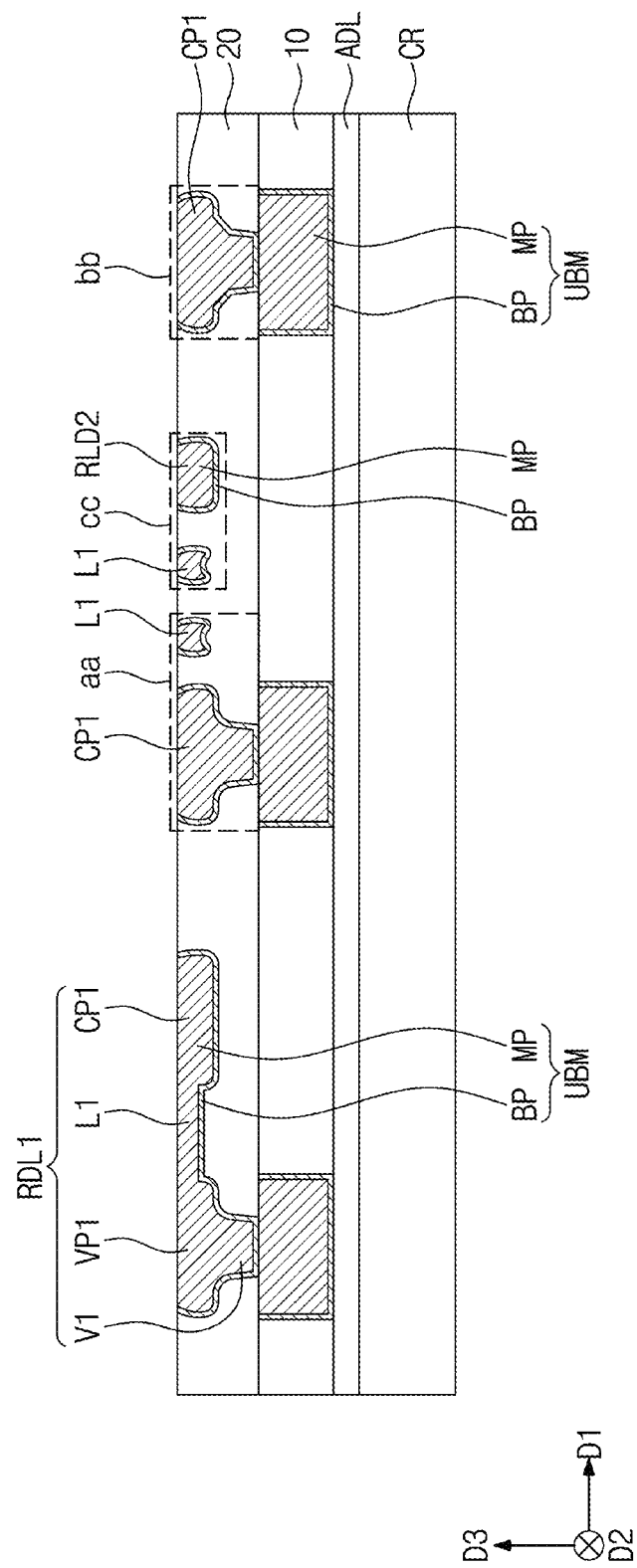

Referring to FIG. 7, a planarization process may be performed on the metal layer 13 and the seed/barrier layer 11 to expose the top surface of the second insulating layer 20. The planarization process may be performed using a chemical mechanical polishing (CMP) process. First redistribution patterns RDL1 and second redistribution patterns RDL2, which are separated from each other, may be formed by the planarization process. Each of the first and second redistribution patterns RDL1 and RDL2 may include the seed/barrier pattern BP and the metal pattern MP.

The first redistribution patterns RDL1 may be lines, which are used to deliver signals, and the second redistribution patterns RDL2 may be dummy lines or power lines connected to a power.

The first and second redistribution patterns RDL1 and RDL2 may have top surfaces that are substantially flat or even. Further, the top surfaces of the second redistribution patterns RDL2 may be substantially coplanar with the top surface of the second insulating layer 20s.

Figure 8:
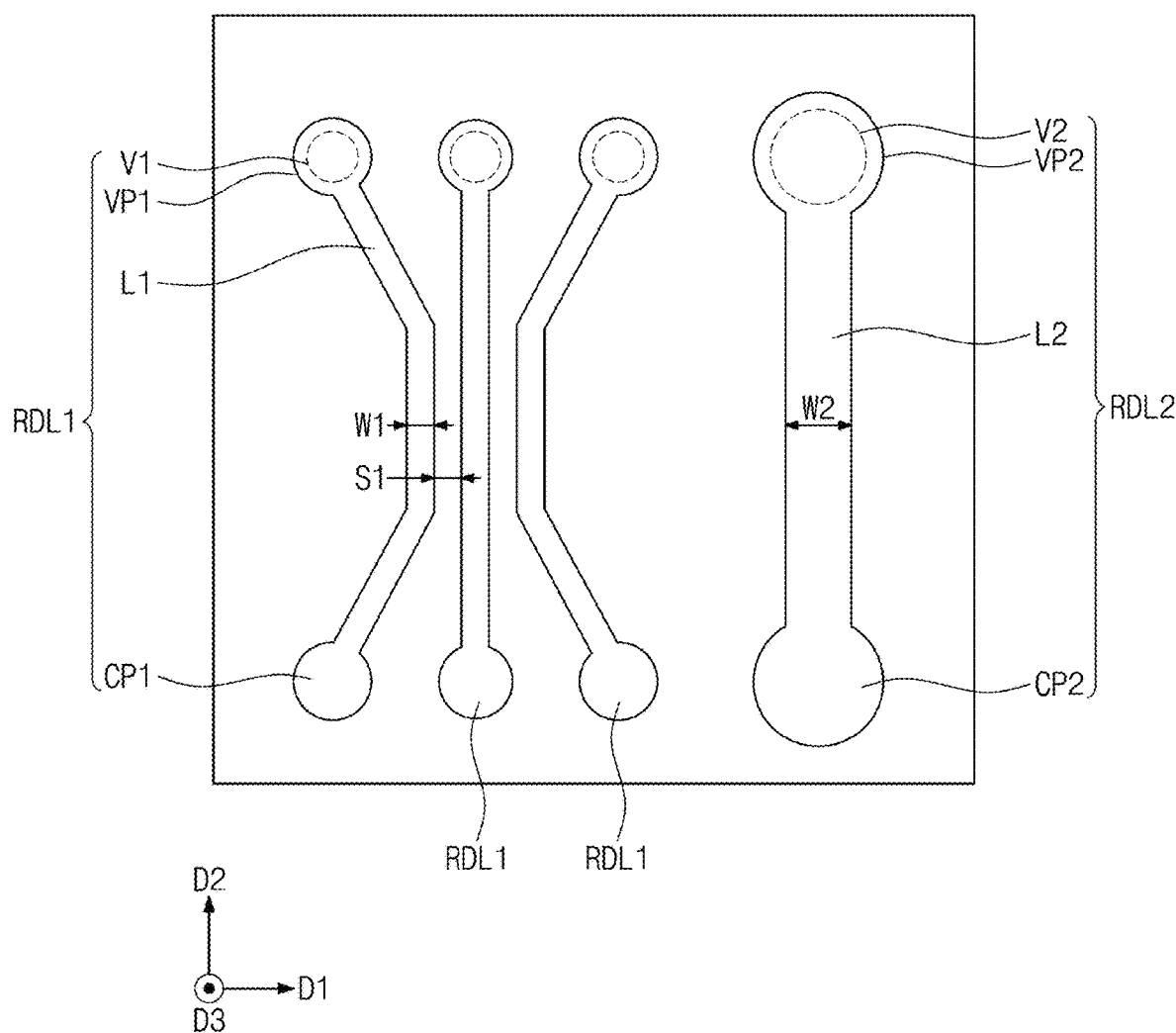
FIG. 8 is a plan view exemplarily illustrating first and second redistribution patterns of a redistribution substrate according to an example embodiment of the inventive concepts.

FIG. 8 is a plan view schematically illustrating the first and second redistribution patterns.

Referring to FIGS. 7 and 8, the first redistribution pattern RDL1 may include a first via pad portion VP1, a first line portion L1, and a first connection pad portion CP1. A first via portion V1 may be provided to penetrate the second insulating layer 20. The first via pad portion VP1 may be connected to the first via portion V1 and may be disposed in the second insulating layer 20. The first connection pad portion CP1 may be connected to an end portion of the first line portion L1 and may be disposed in the second insulating layer 20. The first line portions L1 may extend in the first direction D1 and/or the second direction D2 and may be spaced apart from each other.

The first redistribution pattern RDL1 may have the smallest width (hereinafter, a first width W1) at the first line portion L1, and the first width W1 may be within a range of about 0.5 μm to about 2.0 The first line portions L1 may be spaced apart from each other by a first distance S1. The first distance S1 and the first width W1 may be substantially equal to each other.

In an example embodiment, the second redistribution pattern RDL2 may have a shape similar to the first redistribution pattern RDL1, except that the second redistribution pattern RDL2 has a width larger than the first redistribution pattern RDL1. The second redistribution pattern RDL2 may include a second via pad portion VP2, a second line portion L2, and a second connection pad portion CP2. Although not shown, a second via portion V2 may be provided to penetrate the second insulating layer 20. The second via pad portion VP2 may be connected to the second via portion V2 and may be disposed in the second insulating layer 20. The second connection pad portion CP2 may be connected to an end portion of the second line portion L2 and may be disposed in the second insulating layer 20. The second redistribution pattern RDL2 may have the smallest width (hereinafter, a second width W2) at the second line portion L2, and the second width W2 may be within a range of about 3.0 µm to about 10.0 µm.

Figure 9A:
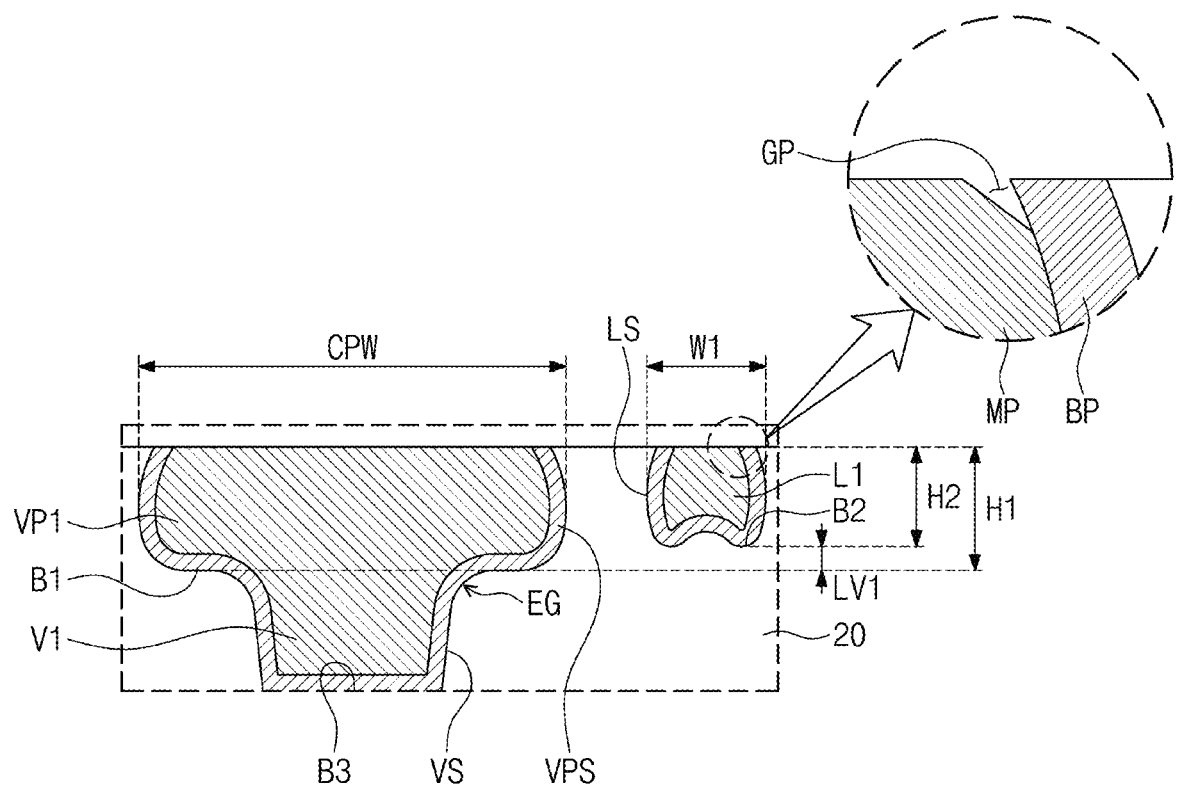
FIGS. 9A, 9B, and 9C are enlarged sectional views respectively illustrating portions aa, bb, and cc of FIG. 7.
Figure 9B:
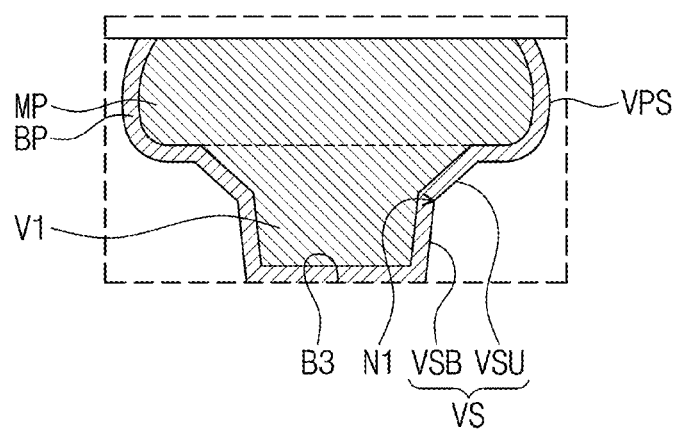
Figure 9C:
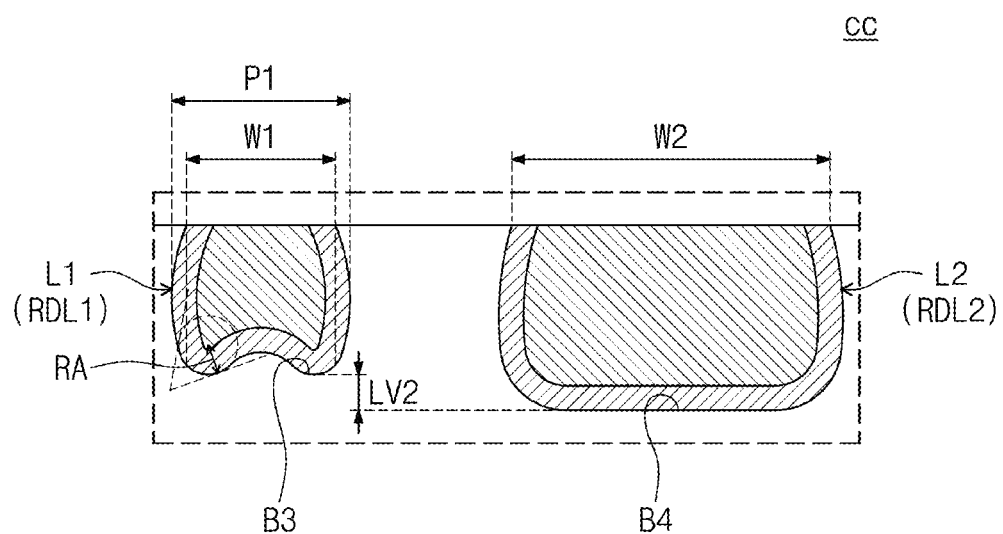

FIGS. 9A, 9B, and 9C are enlarged sectional views respectively illustrating portions aa, bb, and cc of FIG. 7.

Referring to FIGS. 7 and 9A, each of the first redistribution patterns RDL1 may include the seed/barrier pattern BP and the metal pattern MP. The seed/barrier pattern BP may be provided to cover the side and bottom surfaces of the metal pattern MP.

A first thickness H1 of the first via pad portion VP1 of the first redistribution pattern RDL1 may be larger than a second thickness H2 of the first line portion L1. The first thickness H1 may range from about 3.0 µm to 4.3 and the second thickness H2 may range from 2.7 µm to 3.5 µm. A bottom surface B1 of the first via pad portion VP1 may be located at a level lower than a bottom surface B2 of the first line portion L1. A difference LV1 in the level between the bottom surface B1 of the first via pad portion VP1 and the bottom surface B2 of the first line portion L1 may range from about 0.3 µm to 0.8 µm.

In the first redistribution pattern RDL1, the first via pad portion VP1 and the first line portion L1 may have top surfaces that are substantially coplanar with the top surface of the second insulating layer 20. The first via pad portion VP1 and the first line portion L1 may have rounded side surfaces VPS and LS, respectively. The side surfaces VPS and LS of the first via pad portion VP1 and the first line portion L1 may be laterally convex. A side surface VS of the first via portion V1 may have a relatively linear shape.

An angle between the side surface VS of the first via portion V1 and a bottom surface B3 of the first via portion V1 may be greater than 95°. According to an example embodiment of the inventive concepts, the side surface VS of the first via portion V1 may have a linear shape, whereas the side surface VPS of the first via pad portion VP1 may have a rounded shape. This is because, as described with reference to FIGS. 4 and 5, the via hole VH is formed by a photo-patterning process and the first trench T1 is formed by an etching process.

An edge portion EG, at which the side surface VPS of the first via pad portion VP1 and the side surface VS of the first via portion V1 are connected to each other, may have a rounded shape. In other words, the bottom surface of the first pad portion VP1 and the side surface of the first via portion V1 are connected to form an edge portion having a rounded shape. As described with reference to FIG. 5, the corner portion, at which the via hole VH and the first trench T1 are connected to each other, may be more easily etched during the anisotropic etching of the hard mask pattern HMP, thereby having an inclined surface. The corner portion may define a width in the D1 direction that varies along a vertical direction (e.g., along the D3 direction).

The metal pattern MP may have a groove portion GP near the seed/barrier pattern BP or near an edge of the top surface of the first line portion L1. The groove portion GP may have a depth that is greater than 0 nm and is smaller than 300 nm.

This may be because an etch rate of the metal pattern MP is relatively high at an interface between the metal pattern MP and the seed/barrier pattern BP, during the chemical-mechanical planarization process of FIG. 7.

A diameter CPW of the first via pad portion VP1 may be 1.5 or more times larger than the first width W1 of the first line portion L1. The diameter CPW of the first via pad portion VP1 has the largest value at a level between a top surface of the first via pad portion VP1 and the bottom surface of the first via pad portion VP1.

Referring to FIGS. 8 and 9B, the side surface VS of the first via portion V1 may include a lower sidewall portion VSB having a first slope and an upper sidewall portion VSU having a second slope. An inflection point N1, at which the slope varies, may exist between the lower sidewall portion VSB and the upper sidewall portion VSU. The absolute value of the first slope may be greater than the absolute value of the second slope. For example, an angle of the first slope may be smaller than 90°.

The upper sidewall portion VSU may be connected to the bottom surface B3 of the first via pad portion VP1 via the lower sidewall portion VSB. The lower sidewall portion VSB and the upper sidewall portion VSU may have a substantially linear shape.

As described with reference to FIG. 5, the corner portion, at which the via hole VH and the first trench T1 are connected to each other, may be more easily etched during the anisotropic etching of the hard mask pattern HMP, and thus the upper sidewall portion VSU may be formed to have a smaller slope than the lower sidewall portion VSB. The corner portion may define a width in the D1 direction that varies along a vertical direction (e.g., along the D3 direction).

Referring to FIGS. 8 and 9C, the first line portion L1 of the first redistribution pattern RDL1 and the second line portion L2 of the second redistribution pattern RDL2 may be laterally convex.

For example, the first line portion L1 of the first redistribution pattern RDL1 may have the smallest width (hereinafter, the first width W1) at a level of the top or bottom surface of the first line portion L1. Further, the first line portion L1 of the first redistribution pattern RDL1 may have the largest width P1 at a level between the top surface and the bottom surface thereof. In the first line portion L1 of the first redistribution pattern RDL1, a difference between the largest width P1 and the smallest width W1 (e.g., a width of the top surface of the first line portion L1 and/or a width of the bottom surface of the first line portion L1) may be greater than 0 nm and smaller than or equal to 300 nm.

The second line portion L2 of the second redistribution pattern RDL2 may also have the smallest width (hereinafter, the second width W2) at a level of the top or bottom surface of the second line portion L2.

A difference LV2 between a level of the bottom surface B2 of the first line portion L1 of the first redistribution pattern RDL1 and a level of a bottom surface B4 of the second line portion L2 of the second redistribution pattern RDL2 may be greater than 0 µm and may be smaller than 0.5 µm.

The level of the bottom surface of the first line portion L1 of the first redistribution pattern RDL1 may be lowered with increasing a distance from the center portion of the first line portion L1 in an outward direction. In other words, the level of the bottom surface of the first line portion L1 of the first redistribution pattern RDL1 may be highest at the center portion of the first line portion L1. A difference in the level between the center and edge portions of the bottom surface of the first line portion L1 may be greater than 0 nm and may be smaller than 300 nm.

This may be because an edge portion of the second insulating layer 20, which is exposed in the process of etching the second insulating layer 20 using the hard mask pattern HMP of FIGS. 4 and 5, is more etched.

An edge portion of the bottom surface of the first line portion L1 of the first redistribution pattern RDL1 may have a rounded shape. As an example, the edge portion of the bottom surface of the first line portion L1 of the first redistribution pattern RDL1 may have a curvature radius RA of 0.3 μm or larger.

According to an example embodiment of the inventive concepts, the first redistribution pattern RDL1 may include the seed/barrier pattern BP and the metal pattern MP, as described above, and the seed/barrier pattern BP may be disposed between the metal pattern MP and the second insulating layer 20 to mitigate or prevent the metal pattern MP from reacting with the material of the second insulating layer 20 and thereby mitigating or preventing the metal pattern MP from being oxidized. Thus, for a fine line (e.g., the first redistribution pattern RDL1) used to deliver signals, the mitigation or prevention of the oxidation may make it possible to improve reliability of the device.

Figure 10:
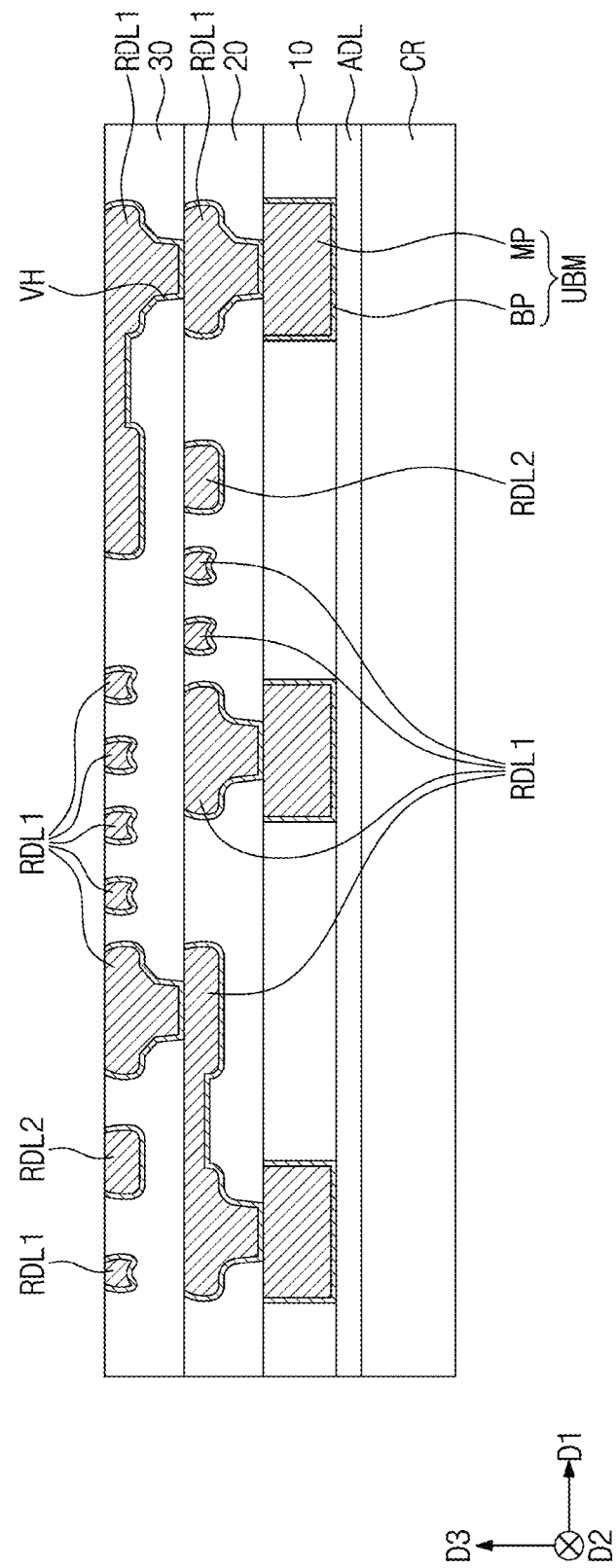

Referring to FIG. 10, a third insulating layer 30 may be formed on the second insulating layer 20 to cover the top surfaces of the first and second redistribution patterns RDL1 and RDL2.

The third insulating layer 30 may be formed of or include at least one of photo-imageable dielectric materials. As an example, the third insulating layer 30 may be formed of or include the same polymer material as the second insulating layer 20.

Next, the via holes VH may be formed in the third insulating layer 30 to expose portions of the first redistribution patterns RDL1. In the case where the third insulating layer 30 includes a photo-imageable polymer, the via holes VH may be formed by performing exposing and developing processes on portions of the third insulating layer 30. A curing process may be performed on the third insulating layer 30, after the formation of the via holes VH.

The first and second redistribution patterns RDL1 and RDL2 may be formed on the third insulating layer 30, like the first and second redistribution patterns RDL1 and RDL2 formed on the second insulating layer 20.

Referring to FIG. 11, a fourth insulating layer 40 may be formed on the third insulating layer 30. The fourth insulating layer 40 may be formed of or include at least one of photo-imageable polymers.

By performing exposing and developing processes on portions of the fourth insulating layer 40, the via holes VH may be formed to expose portions of the first and second redistribution patterns RDL1 and RDL2 provided in the third insulating layer 30.

Thereafter, the seed/barrier layer 11 may be formed to conformally cover a surface of the fourth insulating layer 40 with the via holes VH. A third photoresist pattern PR3 may be formed on the seed/barrier layer 11 to have a plurality of openings. The openings of the third photoresist pattern PR3 may overlap the via holes VH of the fourth insulating layer 40.

Referring to FIG. 11, an electroplating process may be performed to form a first bonding pad pattern 44 and a second bonding pad pattern 46 in the openings of the third photoresist pattern PR3. In an example embodiment, the first bonding pad pattern 44 may be formed of or include copper, and the second bonding pad pattern 46 may be formed of or include at least one of metals (e.g., nickel (Ni) and gold (Au)) or alloys thereof or may have a multi-layered structure containing at least one of metals (e.g., nickel (Ni) and gold (Au)).

Figure 12:
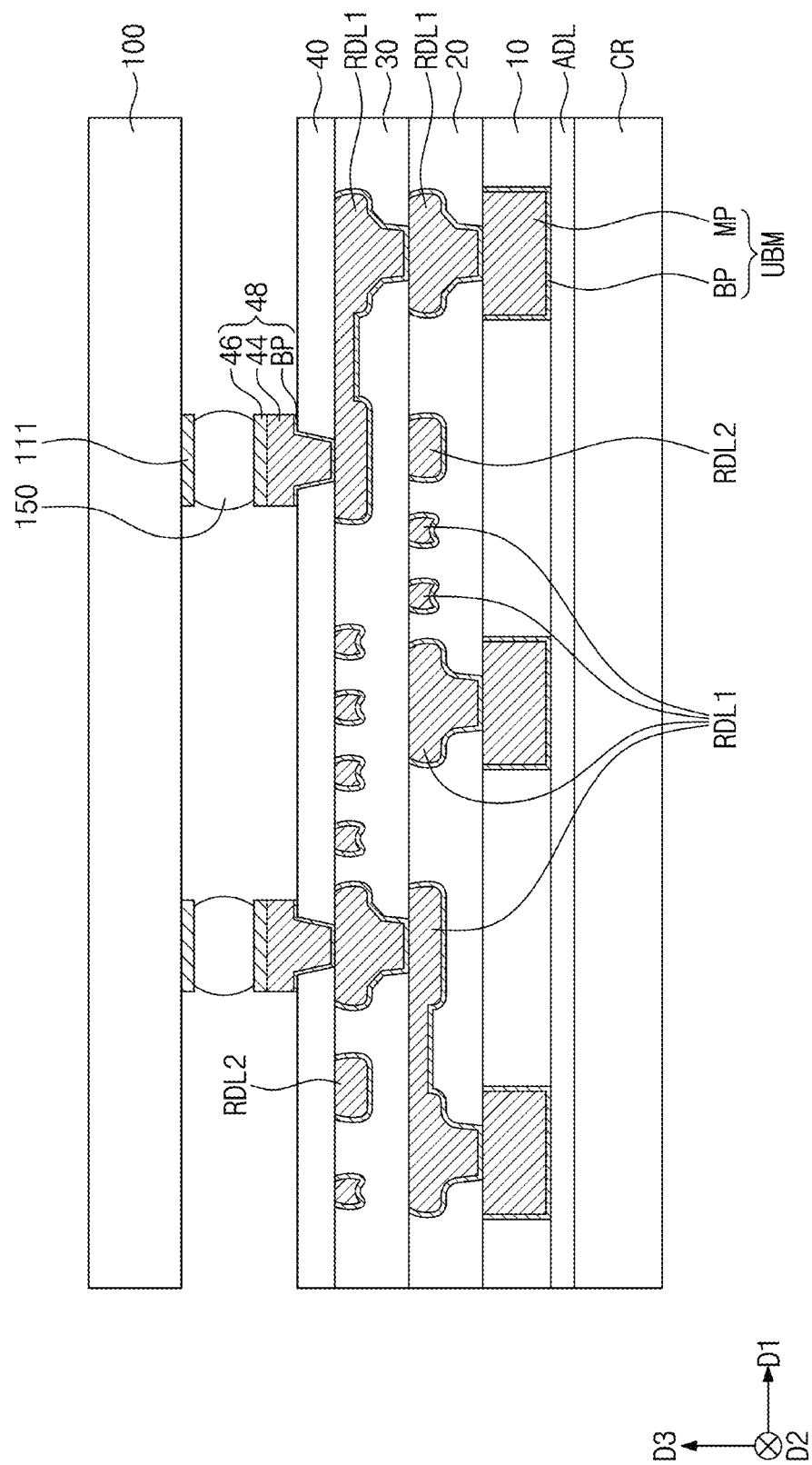

Referring to FIG. 12, the third photoresist pattern PR3 may be removed using a strip process. Next, the seed/barrier layer 11 on the top surface of the fourth insulating layer 40 may be etched using a wet etching process. Accordingly, bonding pads 48 including the seed/barrier pattern BP, the first bonding pad pattern 44, and the second bonding pad pattern 46 may be formed.

Thereafter, connection terminals 150 may be attached on the bonding pads 48 to connect a semiconductor chip 100 to a redistribution substrate 300.

Figure 13:
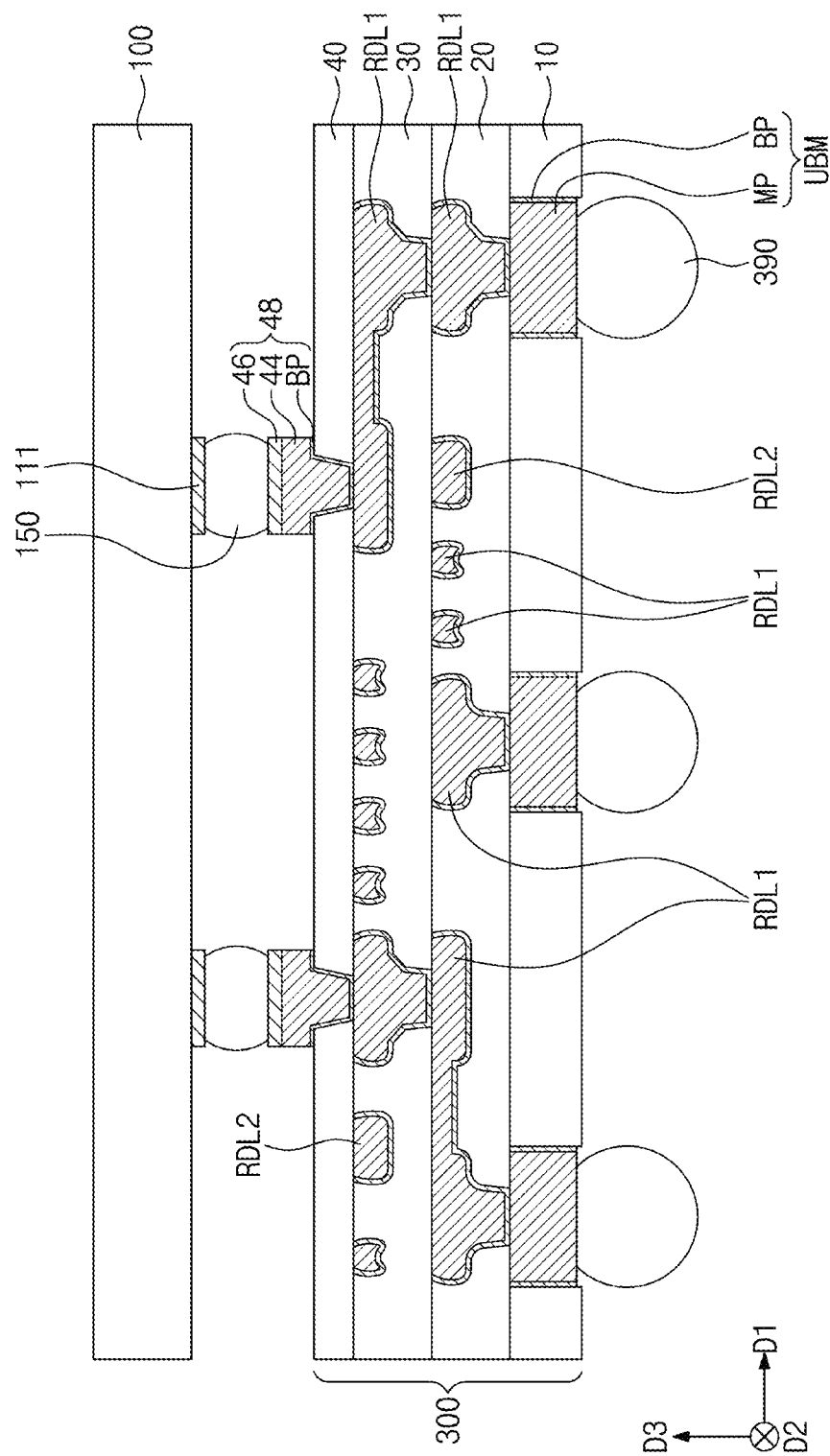

Referring to FIG. 13, the carrier substrate CR and the adhesive layer ADL may be removed. Next, the seed/barrier pattern BP on the bottom surface of the metal pattern MP may be removed to expose the bottom surface of the metal pattern MP provided in the first insulating layer 10. The seed/barrier pattern BP may be selectively interposed between the first insulating layer 10 and the metal pattern MP, and the redistribution substrate 300 may be formed by attaching an outer connection terminal 390 to the exposed bottom surface of the metal pattern MP.

The semiconductor package may include the redistribution substrate 300 and the semiconductor chip 100, which is disposed on the redistribution substrate 300. In an example embodiment, data signals and control signals may be provided to the first redistribution patterns RDL1 whose line portions each have the smallest width (e.g., the first width W1) at the top or bottom surface thereof.

A power voltage and a ground voltage may be provided to the second redistribution patterns RDL2 whose line portions each have the smallest width (e.g., the second width W2 larger than the first width W1) at the top or bottom surface thereof.

Figure 14:
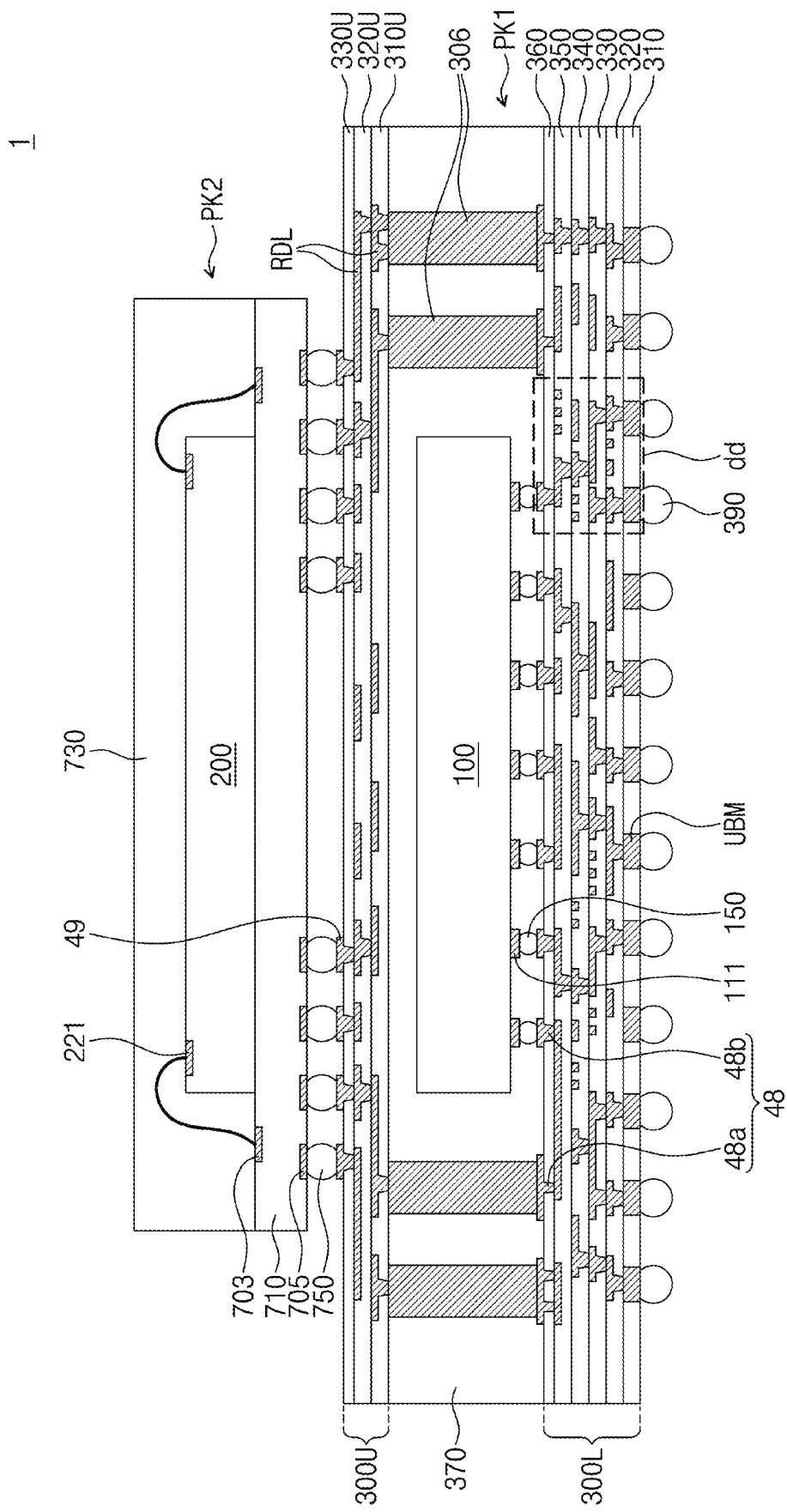
FIG. 14 is a sectional view illustrating a semiconductor package according to an example embodiment of the inventive concepts.
Figure 15:
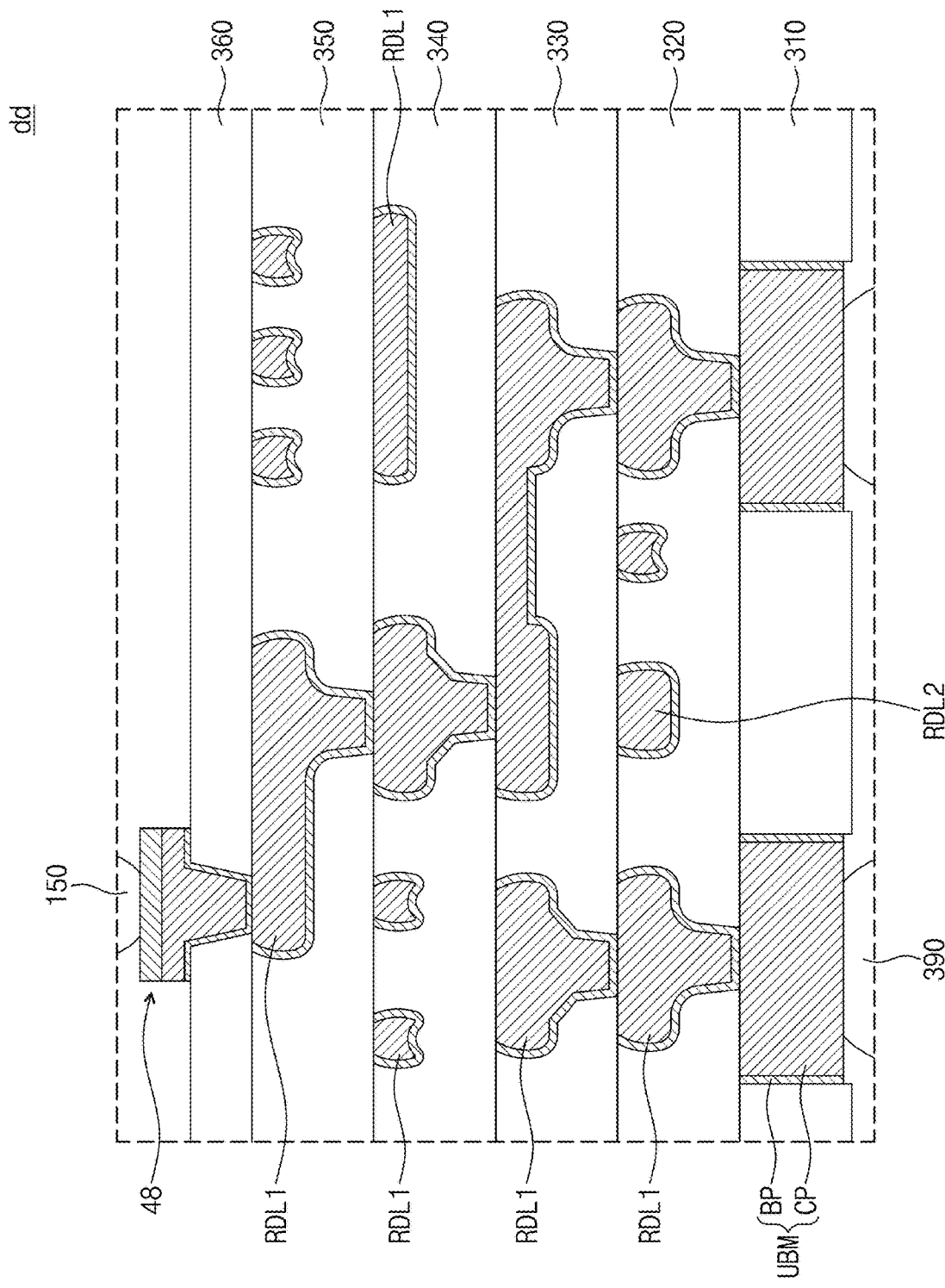
FIG. 15 is an enlarged sectional view illustrating a portion dd of FIG. 14.

FIG. 14 is a sectional view illustrating a semiconductor package according to an example embodiment of the inventive concepts. FIG. 15 is an enlarged sectional view illustrating a portion dd of FIG. 14.

For the sake of brevity, the elements and features of this example that are similar to those previously shown and described will not be described in much further detail.

Referring to FIGS. 14 and 15, a semiconductor package 1 according to the present example embodiment may include a first semiconductor package PK1 and a second semiconductor package PK2, which is disposed on the first semiconductor package PK1.

The first semiconductor package PK1 may include lower and upper redistribution substrates 300L and 300U, a first semiconductor chip 100, metal pillars 306, and a mold layer 370.

Figure 16:
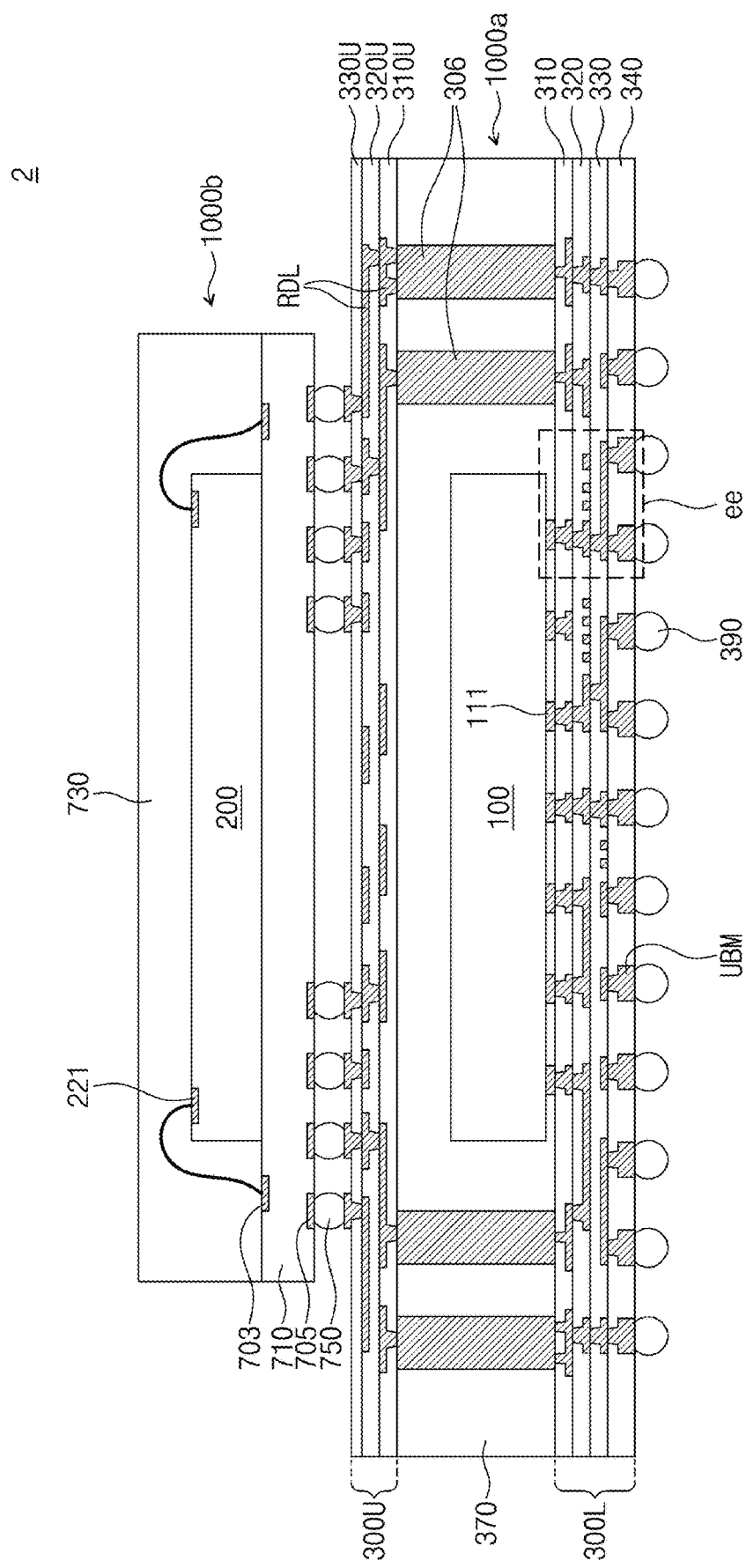
FIG. 16 is a sectional view illustrating a semiconductor package according to an example embodiment of the inventive concepts.

As an example, referring to FIG. 16, the lower redistribution substrate 300L may include first to sixth insulating layers 310, 320, 330, 340, 350, and 360, which are sequentially stacked. In an example embodiment, the first to sixth insulating layers 310, 320, 330, 340, 350, and 360 may be observed as a single insulating layer.

The under-bump patterns UBM described above may be provided in the first insulating layer 310. The first and second redistribution patterns RDL1 and RDL2 described above may be provided in the second to fifth insulating layer 320 to 350. A lower bonding pad 48, which is the same as or substantially similar to the bonding pad 48 described above, may be provided in the sixth insulating layer 360. The lower bonding pad 48 may correspond to the bonding pad 48 described above. The lower bonding pad 48 may include a first lower bonding pad 48a and a second lower bonding pad 48b. In other words, the first and second redistribution patterns RDL1 and RDL2 may be configured to have the same as or substantially similar to the features described above with reference to FIGS. 7, 8, and 9A to 9C.

Referring back to FIG. 14, the first semiconductor chip 100 may be provided on the lower redistribution substrate 300L. The first semiconductor chip 100 may be disposed in a center region of the lower redistribution substrate 300L, when viewed in a plan view. A plurality of chip pads 111 may be disposed on a bottom surface of the first semiconductor chip 100. The first semiconductor chip 100 may be disposed in such a way that the bottom surface thereof face the top surface of the lower redistribution substrate 300L. The first connection terminals 150 may be disposed between and attached to the chip pads 111 of the first semiconductor chip 100 and the uppermost ones of the redistribution patterns RDL1 and RDL2 of the lower redistribution substrate 300L. The chip pads 111 of the first semiconductor chip 100 may be connected to the first lower bonding pad 48a and the redistribution patterns RDL1 and RDL2 of the lower redistribution substrate 300L through the first connection terminals 150.

The metal pillars 306 may be disposed around the first semiconductor chip 100 and may electrically connect the lower redistribution substrate 300L to the upper redistribution substrate 300U. The metal pillars 306 may be provided to penetrate the mold layer 370 and may have top surfaces that are coplanar with the top surface of the mold layer 370. Bottom surfaces of the metal pillars 306 may be in direct contact with the second lower bonding pad 48b.

The mold layer 370 may be provided between the lower and upper redistribution substrates 300L and 300U to cover the first semiconductor chip 100. The mold layer 370 may be provided on the top surface of the lower redistribution substrate 300L to cover the side and top surfaces of the first semiconductor chip 100. The mold layer 370 may fill a space between the metal pillars 306, and a thickness of the mold layer 370 may be substantially equal to a length of the metal pillars 306. The mold layer 370 may be formed of or include at least one of insulating polymers (e.g., epoxy molding compound).

The second connection terminals 390 may be attached to the under-bump patterns UBM. The second connection terminals 390 may be solder balls, which are formed of tin, lead, copper, or the like.

The second semiconductor package PK2 may be disposed on the upper redistribution substrate 300U. In an example embodiment, the upper redistribution substrate 300U may include upper insulating layers 310U, 320U, and 330U, upper redistribution patterns RDL, and an upper bonding pad 49, similar to the lower redistribution substrate 300L.

The second semiconductor package PK2 may include a package substrate 710, a second semiconductor chip 200, and an upper mold layer 730. The package substrate 710 may include a printed circuit board. In an example embodiment, a redistribution substrate may be used as the package substrate 710. A lower conductive pad 705 may be disposed on a bottom surface of the package substrate 710.

The second semiconductor chip 200 may be disposed on the package substrate 710. The second semiconductor chip 200 may include integrated circuits, and in an example embodiment, the integrated circuits may include a memory circuit, a logic circuit, or combinations thereof. A chip pad 221 of the second semiconductor chip 200 may be electrically connected to an upper conductive pad 703, which is provided on a top surface of the package substrate 710, in a wire bonding manner. The upper conductive pad 703 on the top surface of the package substrate 710 may be electrically connected to the lower conductive pad 705 through an internal line in the package substrate 710.

The upper mold layer 730 may be provided on the package substrate 710 to cover the second semiconductor chip 200. The upper mold layer 730 may be formed of or include an insulating polymer (e.g., an epoxy-based polymer).

Third connection terminals 750 may be provided between the lower conductive pad 705 of the package substrate 710 and the upper bonding pad 49. The third connection terminals 750 may be formed of or include at least one of tin-containing metals of low melting temperatures (e.g., soldering materials), but the inventive concepts are not limited to this example.

Figure 17:
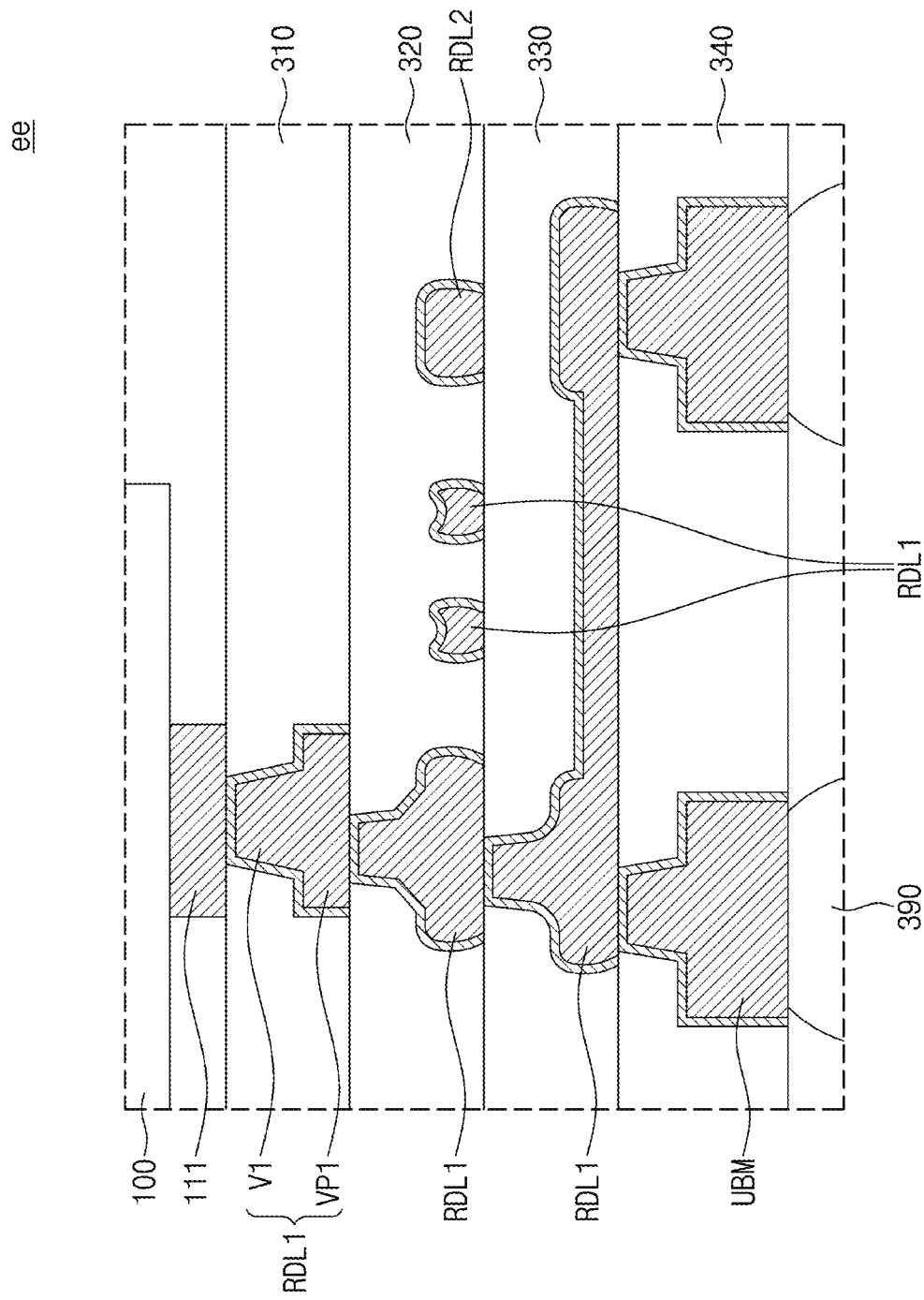
FIG. 17 is an enlarged sectional view illustrating a portion ee of FIG. 16.

FIG. 16 is a sectional view illustrating a semiconductor package 2 according to an example embodiment of the inventive concepts. FIG. 17 is an enlarged sectional view illustrating a portion ee of FIG. 16. For the sake of brevity, the elements and features of this example that are similar to those previously shown and described will not be described in much further detail.

Referring to FIGS. 16 and 17, in the semiconductor package 2 according to the present embodiment, the first semiconductor chip 100 may be disposed in such a way that an active surface thereof is in contact with the top surface of the lower redistribution substrate 300L, differently from the example embodiment of FIGS. 14 and 15.

The lower redistribution substrate 300L may include first to fourth insulating layers 310, 320, 330, and 340, which are sequentially stacked on the chip pads 111 of the first semiconductor chip 100. The first and second redistribution patterns RDL1 and RDL2 may be disposed in the first to third insulating layers 310, 320, and 330.

The via portions V1 of the first redistribution patterns RDL1 may be connected to the chip pads 111 of the first semiconductor chip 100. Although not shown, the via portions of the second redistribution patterns RDL2 may be connected to the chip pads 111 of the first semiconductor chip 100. The first and second redistribution patterns RDL1 and RDL2 may be configured to have the same as or substantially similar to the features described with reference to FIGS. 7, 8, and 9A to 9C.

Figure 18:
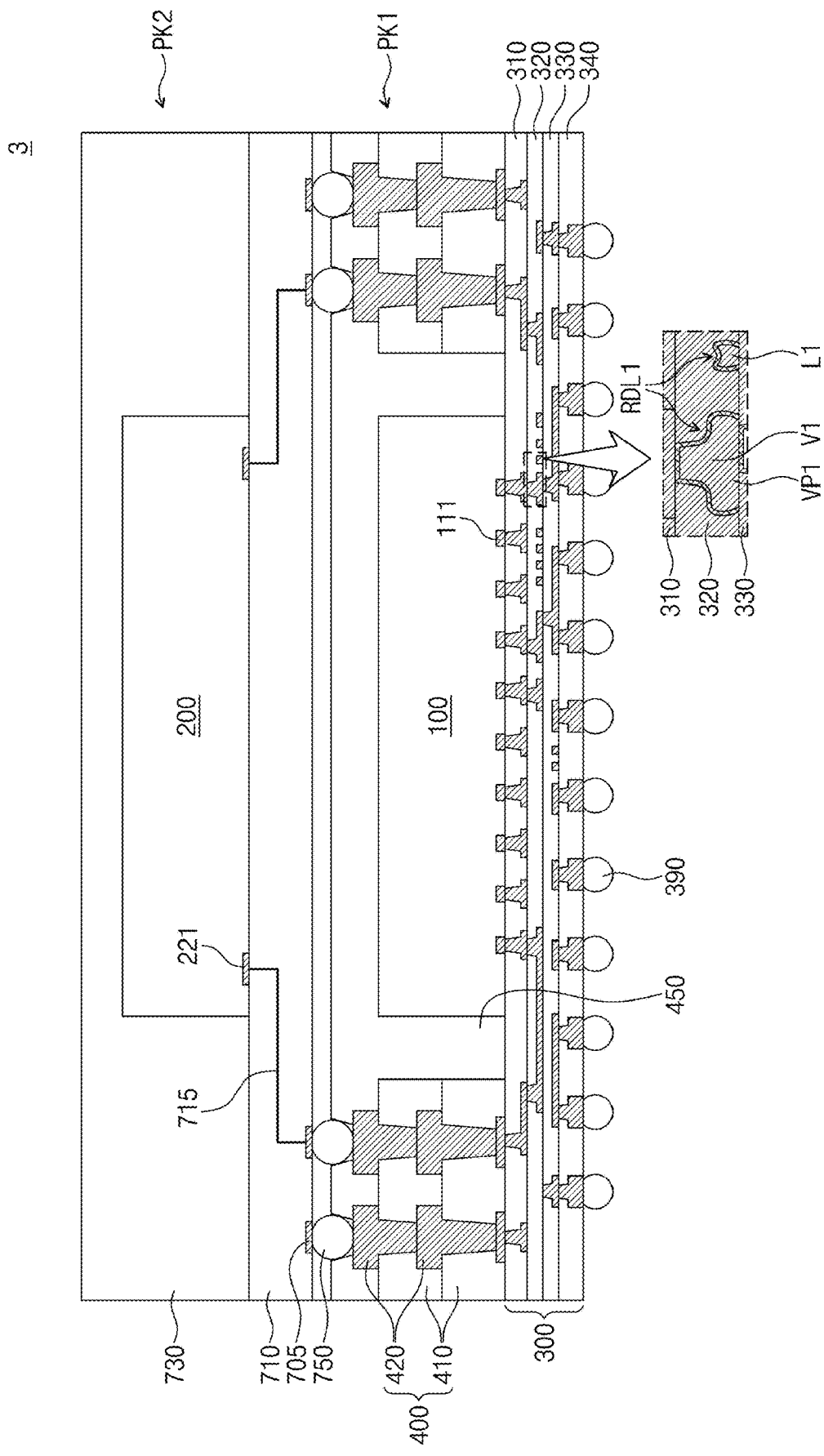
FIG. 18 is a sectional view illustrating a semiconductor package according to an example embodiment of the inventive concepts.

FIG. 18 is a sectional view illustrating a semiconductor package according to an example embodiment of the inventive concepts. Referring to FIG. 18, a semiconductor package 3 according to the present example embodiment may include the first semiconductor package PK1 and the second semiconductor package PK2, which is disposed on the first semiconductor package PK1.

The first semiconductor package PK1 may include the redistribution substrate 300, and a connection substrate 400, the first semiconductor chip 100, and a mold layer 450 that are provided on the redistribution substrate 300.

The redistribution substrate 300 may include the insulating layers 310 to 340 and the redistribution patterns RDL1 and RDL2, as described above.

The connection substrate 400 may have an opening that is formed to expose the top surface of the redistribution substrate 300, and the first semiconductor chip 100 may be disposed in the opening of the connection substrate 400. The connection substrate 400 may be provided before or after the providing of the first semiconductor chip 100. As an example, the connection substrate 400 may be fabricated by forming a hole in a printed circuit board. The first semiconductor chip 100 may be disposed to overlap a center portion of the redistribution substrate 300, when viewed in a plan view.

The connection substrate 400 may include base layers 410 and conductive structures 420. The base layers 410 may be formed of or include at least one of insulating materials. For example, the base layers 410 may be formed of or include at least one of carbon-based, ceramic, or polymer materials. The conductive structure 420 may include interconnection patterns and interconnection vias connecting them. The conductive structures 420 of the connection substrate 400 may be connected to the first and second redistribution patterns RDL1 and RDL2 of the redistribution substrate 300. The conductive structure 420 may be formed of or include at least one of metallic materials. The conductive structure 420 may be formed of or include at least one of, for example, copper, aluminum, gold, lead, stainless steel, silver, iron, or alloys thereof.

The mold layer 450 may be formed on the first semiconductor chip 100 and the connection substrate 400. The mold layer 450 may be extended into a gap between the first semiconductor chip 100 and the connection substrate 400 to fill the gap. The mold layer 450 may be formed of or include at least one of insulating polymers (e.g., epoxy-based polymers). The mold layer 450 may expose portions of the conductive structures 420 of the connection substrate 400.

The second semiconductor package PK2 may include the package substrate 710, the second semiconductor chip 200, and the upper mold layer 730. The package substrate 710 may be a printed circuit board. In an example embodiment, a substrate like the redistribution substrate 300 may be used as the package substrate 710. The lower conductive pads 705 may be disposed on the bottom surface of the package substrate 710.

The second semiconductor chip 200 may be disposed on the package substrate 710. The second semiconductor chip 200 may include integrated circuits, and the integrated circuits may include a memory circuit, a logic circuit, or combinations thereof. The chip pads 221 of the second semiconductor chip 200 may be electrically connected to the lower conductive pads 705 through internal lines 715 provided in the package substrate 710. The upper mold layer 730 may be provided on the package substrate 710 to cover the second semiconductor chip 200. The upper mold layer 730 may be formed of or include at least one of insulating polymers (e.g., epoxy-based polymers).

The third connection terminals 750 may be provided in upper holes of the mold layer 450. The third connection terminals 750 may be in contact with the conductive structures 420 and the lower conductive pad 705.

Figure 19:
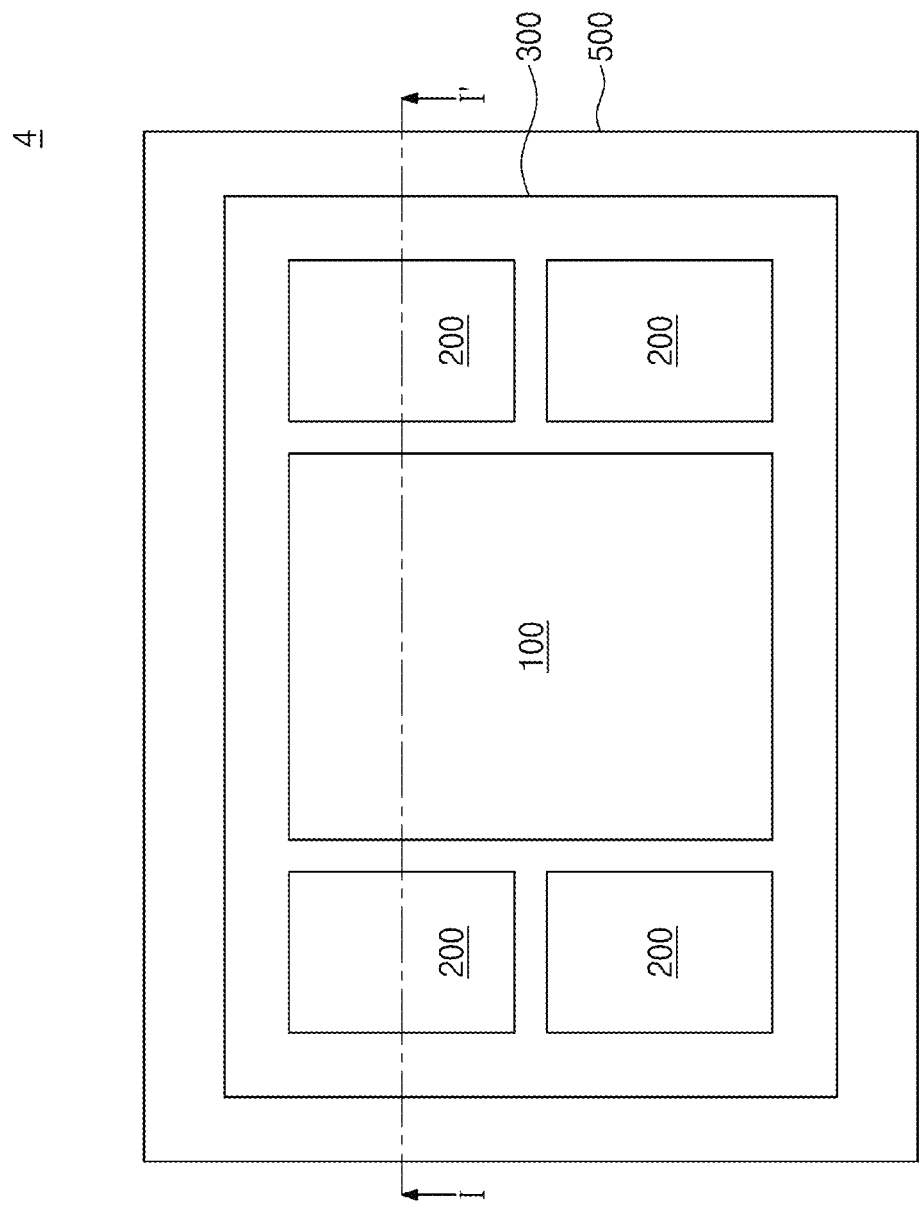
FIG. 19 is a plan view schematically illustrating a semiconductor package according to an example embodiment of the inventive concepts.
Figure 20:
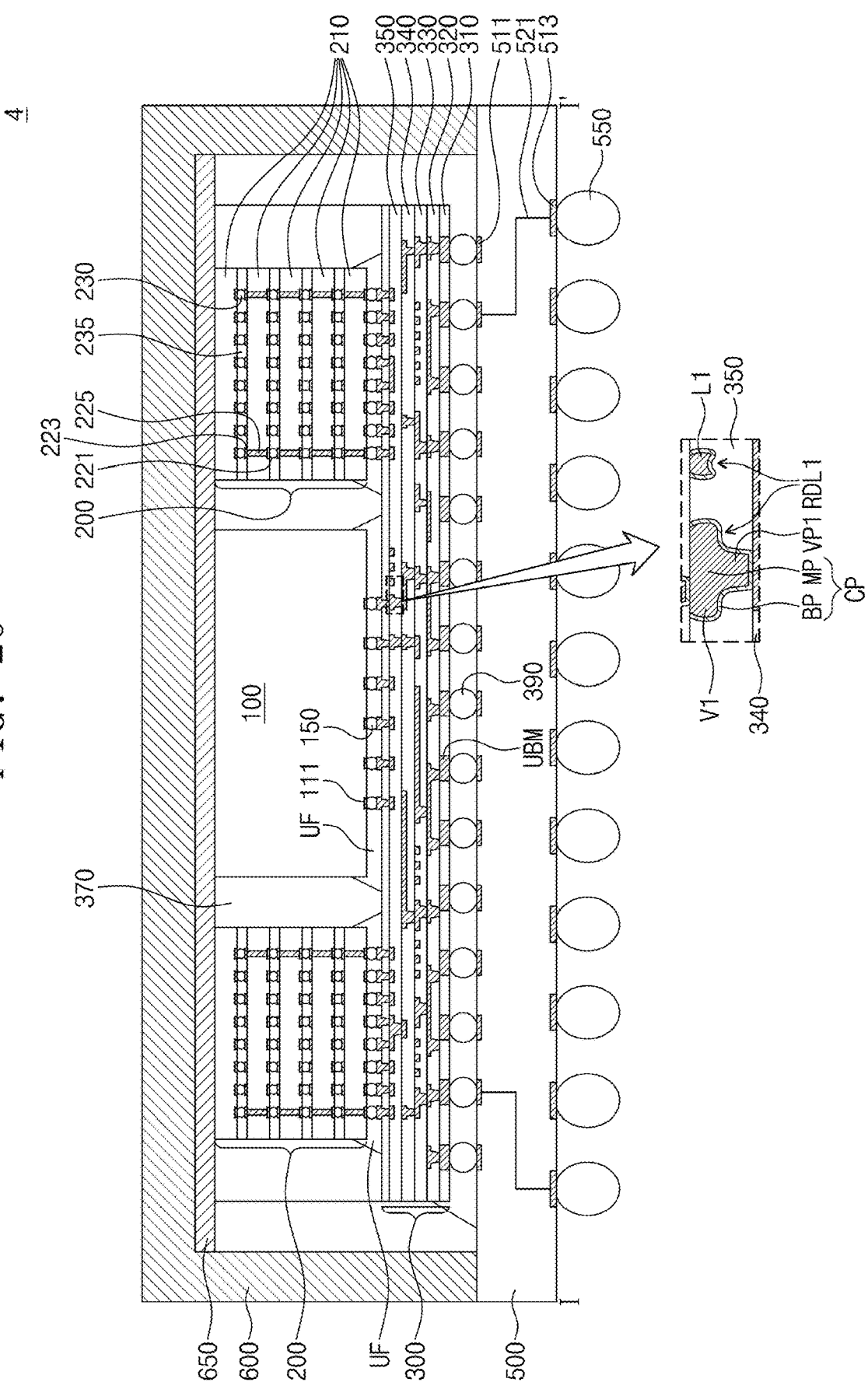
FIG. 20 is a sectional view, which is taken along a line I-I' of FIG. 19 to illustrate a semiconductor package according to an example embodiment of the inventive concepts.

FIG. 19 is a plan view schematically illustrating a semiconductor package according to an example embodiment of the inventive concepts. FIG. 20 is a sectional view, which is taken along a line I-I' of FIG. 19 to illustrate a semiconductor package according to an example embodiment of the inventive concepts.

Referring to FIGS. 19 and 20, a semiconductor package 4 according to the present example embodiment may include first and second semiconductor chips 100 and 200, a redistribution substrate 300, a package substrate 500, and a heat-dissipation structure 600.

The first and second semiconductor chips 100 and 200 may be disposed on the top surface of the redistribution substrate 300.

The first semiconductor chip 100 may include the chip pads 111 provided on the bottom surface thereof. The first semiconductor chip 100 may be a micro electro mechanical systems (MEMS) device, an optoelectronic device, or a logic chip including processors (e.g., a central processing unit (CPU), a graphic processing unit (GPU), a mobile application chip, or a digital signal processor (DSP)). The first semiconductor chip 100 may have a thickness ranging from about 700 μm to about 775 μm.

The second semiconductor chips 200 may be disposed on the redistribution substrate 300 to be spaced apart from the first semiconductor chip 100. Each of the second semiconductor chips 200 may include a plurality of memory chips 210, which are vertically stacked. The memory chips 210 may be connected to each other through upper and lower chip pads 221 and 223, chip penetration vias 225, and connection bumps 230. The memory chips 210 may be stacked on the redistribution substrate 300 in such a way to have side surfaces that are aligned to each other. Adhesive layers 235 may be provided between the memory chips 210, respectively. In an example embodiment, the adhesive layer 235 may be a polymer tape, which is formed of or includes an insulating material. The adhesive layer 235 may be interposed between the connection bumps 230 to mitigate or prevent a short circuit from being formed between the connection bumps 230.

The first and second semiconductor chips 100 and 200 may be connected to the redistribution substrate 300 through the first connection terminals 150. The first connection terminals 150 may be attached to the chip pads 111 and 221 of the first and second semiconductor chips 100 and 200. Each of the first connection terminals 150 may be at least one of solder balls, conductive bumps, or conductive pillars.

The mold layer 370 may be provided on the redistribution substrate 300 to cover the first and second semiconductor chips 100 and 200. A side surface of the mold layer 370 may be aligned to a side surface of the redistribution substrate 300. A top surface of the mold layer 370 may be substantially coplanar with top surfaces of the first and second semiconductor chips 100 and 200. The mold layer 370 may be formed of or include at least one of insulating polymers (e.g., epoxy molding compound).

An under-fill layer UF may be interposed between the first semiconductor chip 100 and the redistribution substrate 300 and between the second semiconductor chips 200 and the redistribution substrate 300. The under-fill layer UF may be provided to fill a space between the first connection terminals 150. The under-fill layer UF may include, for example, a thermo-curable resin or a photo-curable resin. In some example embodiments, the under-fill layer UF may be omitted, and a space between the bottom surfaces of the first and second semiconductor chips 100 and 200 and the redistribution substrate 300 may be filled with the mold layer 370.

The redistribution substrate 300 may be disposed on the package substrate 500 and may be connected to the package substrate 500 through the second connection terminals 390.

The redistribution substrate 300 may include a plurality of insulating layers 310, 320, 330, 340, and 350, which are sequentially stacked, and redistribution patterns, which are provided in the insulating layers 310, 320, 330, 340, and 350, respectively. The second connection terminals 390 may be attached to the under-bump pattern UBM. The second connection terminals 390 may be solder balls, which are formed of tin, lead, copper, or the like. The second connection terminals 390 may have a thickness of about 40 μm to 80 μm.

The package substrate 500 may be, for example, a printed circuit board, a flexible substrate, a tape substrate, or the like. In an example embodiment, the package substrate 500 may be one of a flexible printed circuit board, a rigid printed circuit board, or combinations thereof, in which internal lines 521 are provided.

The package substrate 500 may have a top surface and a bottom surface, which are opposite to each other, and may include upper coupling pads 511, outer coupling pads 513, and internal lines 521. The upper coupling pads 511 may be arranged on the top surface of the package substrate 500, and the outer coupling pads 513 may be arranged on the bottom surface of the package substrate 500. The upper coupling pads 511 may be electrically connected to the outer coupling pads 513 through the internal lines 521. Outer coupling terminals 550 may be attached to the outer coupling pads 513. A ball grid array (BGA) may be provided as the outer coupling terminals 550.

The heat-dissipation structure 600 may be formed of or include at least one of thermally conductive materials. The thermally conductive materials may include metallic materials (e.g., copper and/or aluminum, and so forth) or carbon-containing materials (e.g., graphene, graphite, and/or carbon nanotube, and so forth). The heat-dissipation structure 600 may have a relatively high thermal conductivity. As an example, a single metal layer or a plurality of stacked metal layers may be used as the heat-dissipation structure 600. As another example, the heat-dissipation structure 600 may include a heat sink or a heat pipe. As still another example, the heat-dissipation structure 600 may be configured using a water cooling method.

A thermally conductive layer 650 may be interposed between the first and second semiconductor chips 100 and 200 and the heat-dissipation structure 600. The thermally conductive layer 650 may be in contact with the top surface of the semiconductor package and the bottom surface of the heat-dissipation structure 600. The thermally conductive layer 650 may be formed of or include a thermal interface material (TIM). The thermal interface material may include, for example, polymer and thermally conductive particles. The thermally conductive particles may be dispersed in the polymer. During the operation of the semiconductor package, heat produced in the semiconductor package may be transferred to the heat-dissipation structure 600 through the thermally conductive layer 650.

According to an example embodiment of the inventive concepts, a redistribution substrate may include a redistribution pattern of a fine width, and the redistribution pattern may include a metal pattern, which is disposed in an insulating layer, and a seed/barrier pattern, which is provided between a bottom surface of the metal pattern and the insulating layer and between a side surface of the metal pattern and the insulating layer. Because the seed/barrier pattern is interposed between the side surface of the metal pattern and the insulating layer, it may be possible to mitigate or prevent the metal pattern from being in contact with the insulating layer and thereby mitigating or preventing the metal pattern from being unintentionally oxidized. Accordingly, it may be possible to improve an integration density and reliability of the redistribution substrate.

While some example embodiments of the inventive concepts have been particularly shown and described, it will be understood by one of ordinary skill in the art that variations in form and detail may be made therein without departing from the spirit and scope of the attached claims.

What is claimed is:

1. A method for manufacturing a semiconductor package, comprising:
    forming a redistribution substrate; and
    placing a semiconductor chip on the redistribution substrate,
    wherein the forming a redistribution substrate includes,
    forming an under-bump pattern,
    forming a first photo-imageable dielectric layer including a preliminary via hole exposing the under-bump pattern on the under-bump pattern,
    forming a first hard mask layer covering the first photo-imageable dielectric layer and the under-bump pattern, wherein the first hard mask partially fills the preliminary via hole,
    etching the first hard mask layer and the first photo-imageable dielectric layer sequentially to remove the first hard mask layer in the preliminary via hole and form a via hole from the preliminary via hole and a first hole vertically overlapping and connecting with the via hole,
    removing the first hard mask layer,
    forming a first seed/barrier layer and a first metal layer sequentially to fill the via hole and the first hole, and
    performing a planarization process on the first seed/barrier layer and the first metal layer to form a redistribution pattern.

2. The method for manufacturing a semiconductor package according to claim 1, wherein
    the etching includes placing a first mask pattern including a first opening vertically overlapping the preliminary via hole on the first hard mask layer, and
    a diameter of the first opening is larger than a diameter of the preliminary via hole.

3. The method for manufacturing a semiconductor package according to claim 1, wherein the first hard mask layer comprises a metal material selected from the group consisting of titanium, titanium nitride, tantalum, tantalum nitride, and tungsten.

4. The method for manufacturing a semiconductor package according to claim 1, wherein etching the first hard mask layer includes an anisotropic etching process.

5. The method for manufacturing a semiconductor package according to claim 1, wherein the removing includes a wet etching process.

6. The method for manufacturing a semiconductor package according to claim 1, further comprising:
    forming a trench connected to the first hole when sequentially etching the first hard mask layer and the first photo-imageable dielectric layer,
    wherein the trench extends in a line shape, and a diameter of the first hole is larger than a width of the trench.

7. The method for manufacturing a semiconductor package according to claim 1, further comprising:
    forming a first trench separated from the first hole when sequentially etching the first hard mask layer and the first photo-imageable dielectric layer,
    wherein the first trench extends in a line shape, and a diameter of the first hole is larger than a width of the first trench.

8. The method for manufacturing a semiconductor package according to claim 7, wherein a depth of the first hole is greater than a depth of the first trench.

9. The method for manufacturing a semiconductor package according to claim 7, wherein the first trench has convex sidewalls when viewed from a side.

10. The method for manufacturing a semiconductor package according to claim 7, wherein a level of a center of a bottom surface of the first trench is higher than a level of an edge of the bottom surface.

11. The method for manufacturing a semiconductor package according to claim 7, further comprising:
   forming a second trench separated from the first hole and the first trench when sequentially etching the first hard mask layer and the first photo-imageable dielectric layer,
   wherein the second trench extends in a line shape, and a width of the second trench is larger than the width of the first trench.

12. The method for manufacturing a semiconductor package according to claim 11, wherein a depth of the second trench is greater than a depth of the first trench.

13. The method for manufacturing a semiconductor package according to claim 1, wherein the forming an under bump pattern includes:
   preparing a carrier substrate;
   forming an adhesive layer on the carrier substrate;
   forming a second photo-imageable dielectric layer on the adhesive layer;
   forming a second hard mask layer on the second photo-imageable dielectric layer;
   forming a second mask pattern on the second hard mask layer;
   using the second mask pattern as an etching mask to form a second opening penetrating the second photo-imageable dielectric layer;
   forming a second seed/barrier layer and a second metal layer successively on the second photo-imageable dielectric layer and the adhesive layer, filling the second opening; and
   performing a planarization process on the second seed/barrier layer and the second metal layer.

14. A method for manufacturing a semiconductor package, comprising:
   forming a redistribution substrate; and
   placing a semiconductor chip on the redistribution substrate,
   wherein the forming a redistribution substrate includes,
   forming a photo-imageable dielectric layer,
   forming a hard mask layer on the photo-imageable dielectric layer,
   forming a mask pattern on the hard mask layer, including a first opening and a second opening,
   anisotropically etching the hard mask layer and the photo-imageable dielectric layer to fully remove the hard mask layer exposed by the mask pattern and form a first trench and a second trench vertically overlapping with the first opening and the second opening, respectively,
   removing the hard mask layer and the mask pattern,
   successively forming a seed/barrier layer and a metal layer on the photo-imageable dielectric layer, filling the first trench and the second trench, and
   planarizing the seed/barrier layer and the metal layer,
   wherein a width of the second opening is larger than that of the first opening.

15. The method for manufacturing a semiconductor package according to claim 14, wherein the anisotropically etching includes at least one of a reactive ion etching (RIE), magnetically enhanced reactive ion etching (MERIE), inductively coupled plasma (ICP) etching, transformer coupled plasma (TCP) etching, hollow anode type plasma etching, or helical resonator plasma etching process.

16. The method for manufacturing a semiconductor package according to claim 14, wherein a depth of the first trench is larger than a depth of the second trench.

17. The method for manufacturing a semiconductor package according to claim 14, wherein sidewalls of the first trench and the second trench have a laterally convex shape.

18. The method for manufacturing a semiconductor package according to claim 14, wherein the first trench has a maximum width between a top or a bottom, and the first trench has a minimum width at the top or at the bottom.

19. The method for manufacturing a semiconductor package according to claim 14, wherein a level of a bottom surface of the first trench is higher than a level of a bottom surface of the second trench.

20. The method for manufacturing a semiconductor package according to claim 19, wherein a difference between the level of the bottom surface of the first trench and the level of the bottom surface of the second trench is more than 0 and less than 0.5 μm.

* * * * *